United States Patent
Wei et al.

(10) Patent No.: US 10,535,633 B2
(45) Date of Patent: *Jan. 14, 2020

(54) CHIP PACKAGE HAVING DIE STRUCTURES OF DIFFERENT HEIGHTS AND METHOD OF FORMING SAME

(71) Applicant: Taiwan Semiconductor Manufacturing Company, Ltd., Hsinchu (TW)

(72) Inventors: Wen-Hsin Wei, Hsinchu (TW); Hsien-Pin Hu, Zhubei (TW); Shang-Yun Hou, Jubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/966,873

(22) Filed: Apr. 30, 2018

(65) Prior Publication Data

US 2018/0254260 A1 Sep. 6, 2018

Related U.S. Application Data

(63) Continuation-in-part of application No. 15/784,807, filed on Oct. 16, 2017, now Pat. No. 10,319,699,
(Continued)

(51) Int. Cl.
*H01L 25/065* (2006.01)
*H01L 25/00* (2006.01)
(Continued)

(52) U.S. Cl.
CPC ...... *H01L 25/0652* (2013.01); *H01L 23/5384* (2013.01); *H01L 24/03* (2013.01);
(Continued)

(58) Field of Classification Search
CPC ..... H01L 25/0652; H01L 25/18; H01L 25/50; H01L 23/5384; H01L 23/3128;
(Continued)

(56) References Cited

U.S. PATENT DOCUMENTS

| 6,339,254 B1 | 1/2002 | Venkateshwaran et al. |
| 6,549,821 B1 | 4/2003 | Farnworth et al. |

(Continued)

FOREIGN PATENT DOCUMENTS

| CN | 106558573 A | 4/2017 |
| KR | 20110106159 A | 9/2011 |

(Continued)

*Primary Examiner* — Tong-Ho Kim
(74) *Attorney, Agent, or Firm* — Slater Matsil, LLP

(57) ABSTRACT

Structures and formation methods of a chip package are provided. The chip package includes a substrate, a first chip stack attached to the substrate, and a second chip stack attached to the substrate. The first chip stack and the second chip stack being attached to a same side of the substrate. The chip package further includes a molding compound layer surrounding the first chip stack and the second chip stack. The molding compound layer covers a topmost surface of the first chip stack. A topmost surface of the molding compound layer is substantially coplanar with a topmost surface of the second chip stack.

20 Claims, 22 Drawing Sheets

Related U.S. Application Data which is a continuation of application No. 15/003,150, filed on Jan. 21, 2016, now Pat. No. 9,806,058.

(60) Provisional application No. 62/188,169, filed on Jul. 2, 2015.

(51) Int. Cl.

| | | |
|---|---|---|
| *H01L 23/538* | (2006.01) | |
| *H01L 23/00* | (2006.01) | |
| *H01L 25/18* | (2006.01) | |
| *H01L 23/31* | (2006.01) | |
| *H01L 21/56* | (2006.01) | |

(52) U.S. Cl.
CPC .............. *H01L 24/09* (2013.01); *H01L 24/17* (2013.01); *H01L 24/96* (2013.01); *H01L 25/18* (2013.01); *H01L 25/50* (2013.01); *H01L 21/568* (2013.01); *H01L 23/3128* (2013.01); *H01L 24/13* (2013.01); *H01L 24/16* (2013.01); *H01L 24/81* (2013.01); *H01L 2224/0401* (2013.01); *H01L 2224/04105* (2013.01); *H01L 2224/06181* (2013.01); *H01L 2224/08235* (2013.01); *H01L 2224/12105* (2013.01); *H01L 2224/13082* (2013.01); *H01L 2224/13111* (2013.01); *H01L 2224/13147* (2013.01); *H01L 2224/16146* (2013.01); *H01L 2224/16227* (2013.01); *H01L 2224/16235* (2013.01); *H01L 2224/16238* (2013.01); *H01L 2224/17181* (2013.01); *H01L 2224/32145* (2013.01); *H01L 2224/32225* (2013.01); *H01L 2224/73204* (2013.01); *H01L 2224/73259* (2013.01); *H01L 2224/81815* (2013.01); *H01L 2224/9202* (2013.01); *H01L 2224/96* (2013.01); *H01L 2225/06513* (2013.01); *H01L 2225/06517* (2013.01); *H01L 2225/06541* (2013.01); *H01L 2924/1436* (2013.01); *H01L 2924/1437* (2013.01); *H01L 2924/15311* (2013.01); *H01L 2924/182* (2013.01); *H01L 2924/18161* (2013.01)

(58) Field of Classification Search
CPC ......... H01L 24/03; H01L 24/09; H01L 24/96; H01L 21/568; H01L 2224/04105; H01L 2224/06181; H01L 2224/08235; H01L 2224/12105; H01L 2224/16227; H01L 2224/16235; H01L 2224/17181; H01L 2224/32225; H01L 2224/73204; H01L 2224/73259; H01L 2225/06513; H01L 2225/06517; H01L 2225/06541; H01L 2924/1436; H01L 2924/1437; H01L 2924/15311; H01L 2924/18161; H01L 2924/182

USPC ........................................................ 257/773
See application file for complete search history.

(56) References Cited

U.S. PATENT DOCUMENTS

| | | |
|---|---|---|
| 6,624,005 B1 | 9/2003 | DiCaprio et al. |
| 6,929,976 B2 | 8/2005 | Chan et al. |
| 7,095,112 B2 | 8/2006 | Endo et al. |
| 7,749,807 B2 | 7/2010 | Kamezos |
| 7,923,828 B2 | 4/2011 | Endo et al. |
| 8,456,856 B2 | 6/2013 | Lin et al. |
| 8,552,567 B2 | 10/2013 | England et al. |
| 8,803,306 B1 | 8/2014 | Yu et al. |
| 9,076,754 B2 | 7/2015 | Hung et al. |
| 9,209,151 B2 | 12/2015 | Chauhan et al. |
| 9,276,180 B2 | 3/2016 | Ishida et al. |
| 9,305,809 B1 | 4/2016 | Espiritu et al. |
| 9,362,204 B2 | 6/2016 | Woychik et al. |
| 9,583,415 B2 | 2/2017 | Yu et al. |
| 9,589,945 B2 | 3/2017 | Jo et al. |
| 9,806,058 B2 | 10/2017 | Wei et al. |
| 9,847,319 B2 | 12/2017 | Song et al. |
| 9,865,578 B2 | 1/2018 | Zhou et al. |
| 2004/0195667 A1 | 10/2004 | Kamezos |
| 2004/0245674 A1 | 12/2004 | Yew et al. |
| 2009/0206455 A1 | 8/2009 | Harper et al. |
| 2012/0252165 A1* | 10/2012 | Nakanoya ............... H01L 21/56 438/107 |
| 2012/0317332 A1 | 12/2012 | Kwak et al. |
| 2013/0049191 A1 | 2/2013 | Miura |
| 2013/0049221 A1 | 2/2013 | Han et al. |
| 2013/0075881 A1 | 3/2013 | Huang et al. |
| 2013/0099368 A1 | 4/2013 | Han |
| 2013/0176746 A1 | 7/2013 | Nishimura et al. |
| 2013/0307144 A1* | 11/2013 | Yu ........................... H01L 24/81 257/737 |
| 2014/0097535 A1 | 4/2014 | He et al. |
| 2014/0185248 A1 | 7/2014 | Mizushiro |
| 2014/0346671 A1 | 11/2014 | Yu et al. |
| 2015/0155218 A1* | 6/2015 | Hung ..................... H01L 23/36 257/690 |
| 2015/0318228 A1 | 11/2015 | Ito |
| 2016/0013172 A1 | 1/2016 | Lin et al. |
| 2016/0064355 A1 | 3/2016 | Pan et al. |
| 2016/0064365 A1 | 3/2016 | Jang et al. |
| 2016/0099218 A1 | 4/2016 | Lee et al. |
| 2016/0329304 A1 | 11/2016 | Hatakeyama et al. |
| 2016/0343635 A1 | 11/2016 | Rae et al. |
| 2016/0351492 A1 | 12/2016 | Watanabe et al. |
| 2017/0025385 A1 | 1/2017 | Song et al. |
| 2017/0084589 A1 | 3/2017 | Kuo et al. |
| 2017/0162542 A1* | 6/2017 | Chen .................. H01L 23/3672 |

FOREIGN PATENT DOCUMENTS

| | | |
|---|---|---|
| TW | 201523827 A | 6/2015 |
| TW | 201703221 A | 1/2017 |
| TW | 201742222 A | 12/2017 |

* cited by examiner ns and Method of Forming Same," which is a continuation of U.S. patent application Ser. No. 15/003,150, filed on Jan. 21, 2016, now U.S. Pat. No. 9,806,058, issued Oct. 31, 2017, entitled "Chip Package Having Die Structures of Different Heights and Method of Forming Same," which claims the benefit of U.S. Provisional Application No. 62/188,169, filed on Jul. 2, 2015, entitled "Structure and Formation Method of Package," which applications are hereby incorporated herein by reference.

CHIP PACKAGE HAVING DIE STRUCTURES OF DIFFERENT HEIGHTS AND METHOD OF FORMING SAME

PRIORITY CLAIM AND CROSS-REFERENCE

This application is a continuation-in-part of U.S. patent application Ser. No. 15/784,807, filed on Oct. 16, 2017, entitled "Chip Package Having Die Structures of Different Heights and Method of Forming Same," which is a continuation of U.S. patent application Ser. No. 15/003,150, filed on Jan. 21, 2016, now U.S. Pat. No. 9,806,058, issued Oct. 31, 2017, entitled "Chip Package Having Die Structures of Different Heights and Method of Forming Same," which claims the benefit of U.S. Provisional Application No. 62/188,169, filed on Jul. 2, 2015, entitled "Structure and Formation Method of Package," which applications are hereby incorporated herein by reference.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies have been developed to improve the density and functions of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
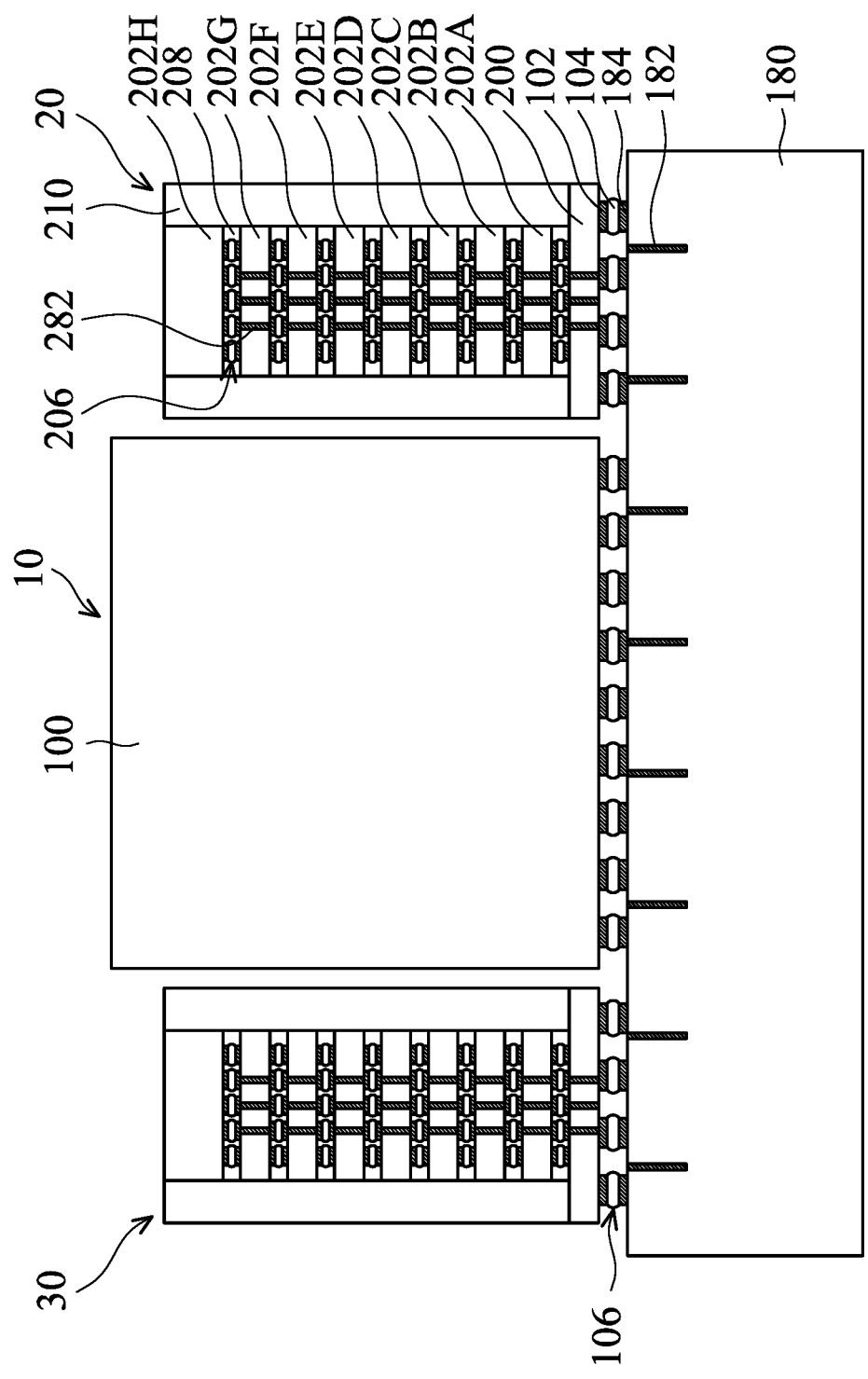
FIGS. 1A-1F are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1F are cross-sectional views of various stages of a process for forming a chip package, in accordance with some embodiments. Additional operations can be provided before, during, and/or after the stages described in FIGS. 1A-1F. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a semiconductor chip 10 and chip stacks 20 and 30 are bonded over a substrate 180, in accordance with some embodiments. In some embodiments, the semiconductor chip 10 is higher than the chip stack 20 or 30. In some embodiments, the semiconductor chip 10 includes a semiconductor substrate 100 and an interconnection structure (not shown) formed on the semiconductor substrate 100. For example, the interconnection structure is formed on a bottom surface of the semiconductor substrate 100. The interconnection structure includes multiple interlayer dielectric layers and multiple conductive features formed in the interlayer dielectric layers. These conductive features include conductive lines, conductive vias, and conductive contacts. Some portions of the conductive features may be used as conductive pads.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected through the interconnection structure to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor chip 10 is a system-on-chip (SoC) chip that includes multiple functions.

In some embodiments, each of the chip stacks 20 and 30 includes multiple semiconductor dies that are stacked. As shown in FIG. 1A, the chip stack 20 includes semiconductor dies 200, 202A, 202B, 202C, 202D, 202E, 202F, 202G, and 202H. In some embodiments, the chip stack 20 includes a molding compound layer 210 that encapsulates and protects these semiconductor dies. The molding compound layer 210 may include an epoxy-based resin with fillers dispersed therein. The fillers may include insulating fibers, insulating particles, other suitable elements, or a combination thereof.

In some embodiments, the semiconductor dies 202A, 202B, 202C, 202D, 202E, 202F, 202G, and 202H are memory dies. The memory dies may include memory devices such as static random access memory (SRAM) devices, dynamic random access memory (DRAM) devices, other suitable devices, or a combination thereof. In some embodiments, the semiconductor die 200 is a control die that is electrically connected to the memory dies stacked thereon. The chip stack 20 may function as a high bandwidth memory (HBM). In some embodiments, the chip stack 30 is also a high bandwidth memory that includes multiple stacked memory dies.

Many variations and/or modifications can be made to embodiments of the disclosure. In some embodiments, one of the chip stacks 20 and 30 includes only a single chip. In these cases, the reference number 20 or 30 can be used to designate a semiconductor chip.

In some embodiments, conductive bonding structures 206 are formed between these semiconductor dies 200, 202A, 202B, 202C, 202D, 202E, 202F, 202G, and 202H to bond them together, as shown in FIG. 1A. In some embodiments, each of the conductive bonding structures 206 includes metal pillars and/or solder bumps. In some embodiments, underfill elements 208 are formed between these semiconductor dies to surround and protect the conductive bonding structures 206. In some embodiments, the underfill element 208 includes an epoxy-based resin with fillers dispersed therein. The fillers may include insulating fibers, insulating particles, other suitable elements, or a combination thereof. In some embodiments, the size and/or density of the fillers dispersed in the underfill element 208 is smaller than those dispersed in the molding compound layer 210.

In some embodiments, multiple conductive features 282 are formed in some of the semiconductor dies in the chip stack 20, as shown in FIG. 1A. Each of the conductive features 282 penetrates through one of the semiconductor dies 200, 202A, 202B, 202C, 202D, 202E, 202F, 202G, and 202H and is electrically connected to one of the conductive bonding structures 206. The conductive features 282 are used as through substrate vias (TSVs). Electrical signals can be transmitted between these vertically stacked semiconductor dies through the conductive features 282.

As shown in FIG. 1A, the semiconductor chip 10 and the chip stacks 20 and 30 are bonded onto the substrate 180 through conductive bonding structures 106, in accordance with some embodiments. In some embodiments, the conductive bonding structures 106 include solder bumps, metal pillar bumps, other suitable structures, or a combination thereof. In some embodiments, each of the conductive bonding structures 106 includes a metal pillar bump 102, a solder element 104, and a metal pillar bump 184, as shown in FIG. 1A. For example, the metal pillar bumps 102 and 184 are substantially made of copper.

In some embodiments, a number of metal pillar bumps 102 are formed over the bottom surfaces of the semiconductor chip 10 and the chip stacks 20 and 30. In some embodiments, a number of metal pillar bumps 184 are formed over the substrate 180 before the bonding with the semiconductor chip 10 and the chip stacks 20 and 30.

In some embodiments, solder material, such as solder paste, is applied on one or both of the metal pillar bumps 102 and 184 before the bonding process. Afterwards, the metal pillar bumps 102 and 184 are bonded together through the solder material. The solder material forms the solder elements 104 between the metal pillar bumps 102 and 184. As a result, the conductive bonding structures 106 are formed, as shown in FIG. 1A. In some embodiments, the solder material is an alloy material that includes tin (Sn). The solder material also includes another element. The element may include lead, silver, copper, nickel, bismuth, another suitable element, or a combination thereof. In some embodiments, the solder material does not include lead.

In some embodiments, the substrate 180 includes a semiconductor material, a ceramic material, an insulating material, a polymer material, another suitable material, or a combination thereof. In some embodiments, the substrate 180 is a semiconductor substrate. The semiconductor substrate may be a semiconductor wafer, such as a silicon wafer. In some embodiments, the substrate 180 may comprise a silicon-on-insulator (SOI) substrate. The SOI substrate may comprise a layer of a semiconductor material (e.g., silicon, germanium and/or the like) formed over an insulator layer (e.g., buried oxide and/or the like), which is formed on a silicon substrate.

As shown in FIG. 1A, a number of conductive features 182 are formed in the substrate 180, in accordance with some embodiments. In some embodiments, the conductive features 182 are formed before the formation of the metal pillar bumps 184. In some embodiments, each of the conductive features 182 is electrically connected to one of the metal pillar bumps 184. Interconnection structures (not shown) including, for example, redistribution layers may be used to form electrical connections between the conductive features 182 and the metal pillar bumps 184. In some embodiments, insulating elements (not shown) are formed between the conductive features 182 and the substrate 180 to prevent short circuiting between different conductive features 182.

In some embodiments, the conductive features 182 are made of copper, aluminum, titanium, tungsten, cobalt, gold, platinum, another suitable material, or a combination thereof. In some embodiments, the insulating elements are made of silicon oxide, silicon nitride, silicon oxynitride, silicon carbide, another suitable material, or a combination thereof. In some embodiments, one or more photolithography and etching processes are used to form a number of openings that define the positions of the conductive features 182. Afterwards, an insulating layer and a conductive layer are sequentially deposited over the substrate 180 to fill the openings. A planarization process is then performed to remove the portions of the insulating layer and the conductive layer outside of the openings. As a result, the remaining portions of the insulating layer and the conductive layer in the openings form the insulating elements and the conductive features 182, respectively.

Figure 1B:
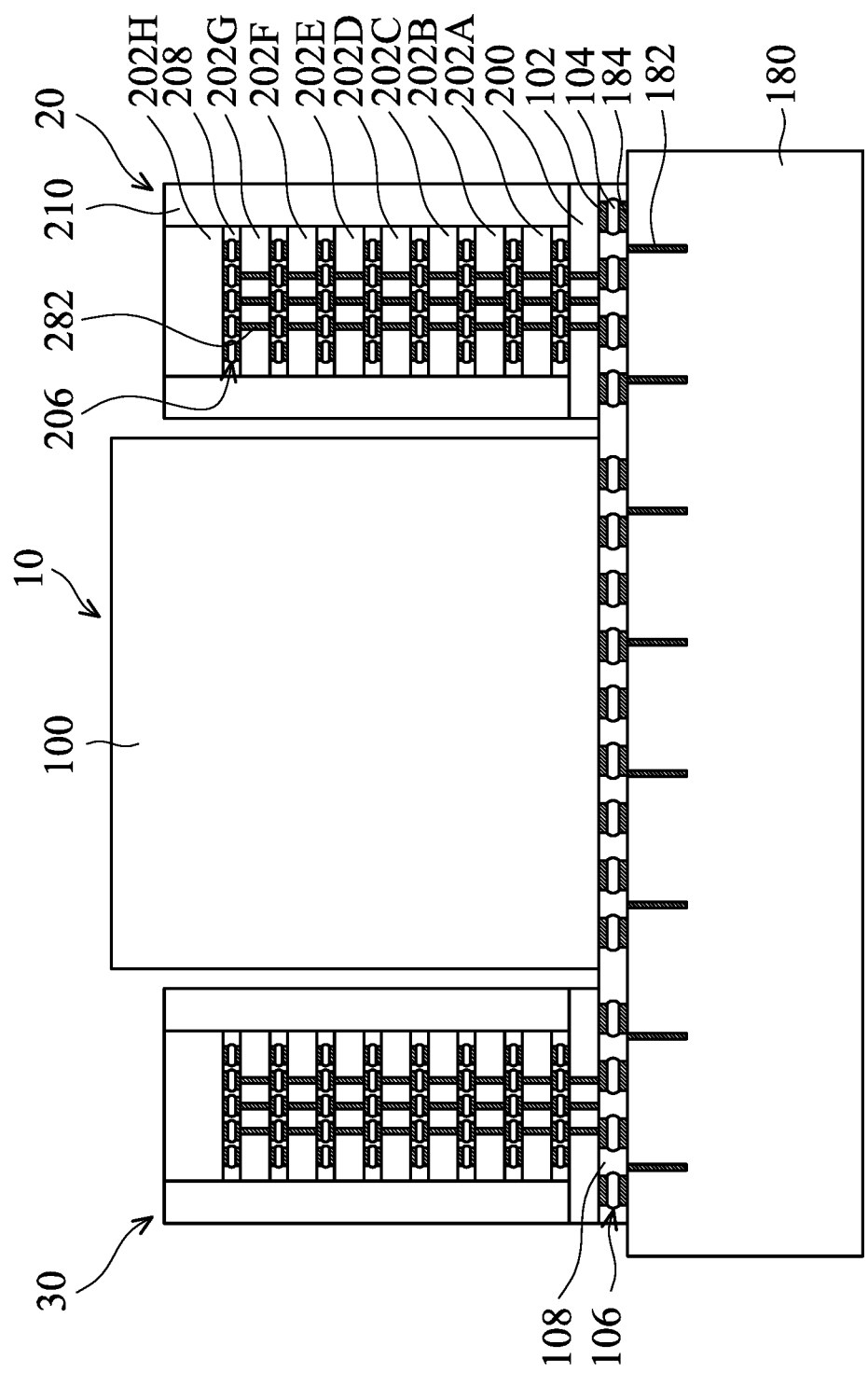

As shown in FIG. 1B, an underfill layer 108 is formed to surround and protect the conductive bonding structures 106, in accordance with some embodiments. In some embodiments, the underfill layer 108 is in direct contact with the conductive bonding structures 106. In some embodiments, a liquid underfill material is dispensed by capillary action and cured to form the underfill layer 108. In some embodiments, the underfill layer 108 includes an epoxy-based resin with fillers dispersed therein. The fillers may include fibers, particles, other suitable elements, or a combination thereof.

Figure 1C:
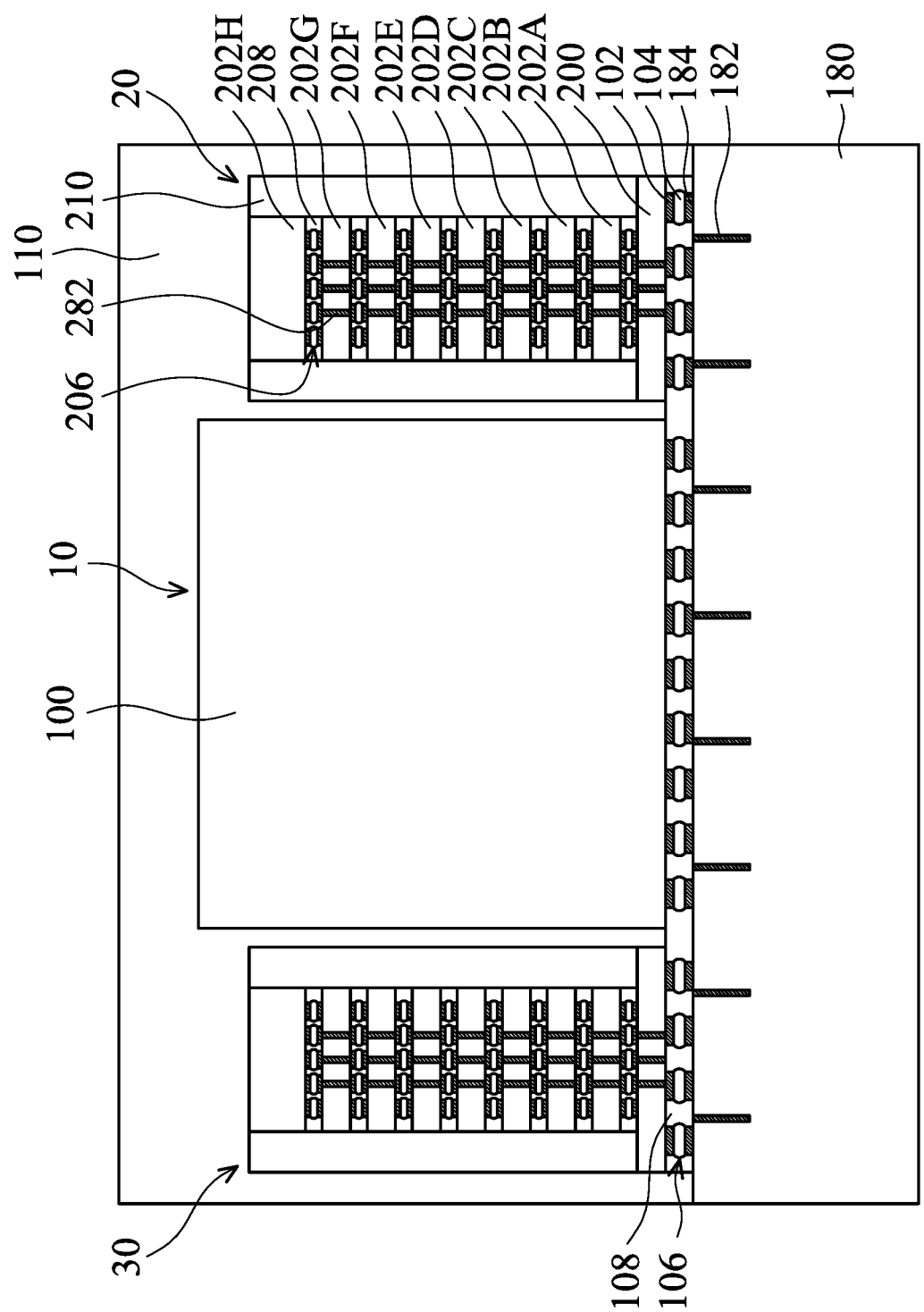

As shown in FIG. 1C, a package layer 110 is formed over the substrate 180 to encapsulate the semiconductor chip 10 and the chip stacks 20 and 30, in accordance with some embodiments. In some embodiments, the package layer 110 fills gaps between the semiconductor chip 10 and the chip stack 20 or 30. In some embodiments, the package layer 110 is in direct contact with the underfill layer 108. In some embodiments, the package layer 110 is not in direct contact with the conductive bonding structures 106. In some embodiments, the package layer 110 is in direct contact with the molding compound layers 210 of the chip stacks 20 and 30.

In some embodiments, the package layer 110 includes a polymer material. In some embodiments, the package layer 110 is a molding compound layer. The molding compound layer may include an epoxy-based resin with fillers dispersed therein. The fillers may include insulating fibers, insulating particles, other suitable elements, or a combination thereof. In some embodiments, the size and/or density of the fillers dispersed in the package layer 110 is greater than those dispersed in the underfill layer 108.

In some embodiments, a liquid molding compound material is applied, and a thermal operation is then applied to cure the liquid molding compound material. As a result, the liquid molding compound material is hardened and transformed into the package layer 110. In some embodiments, the thermal operation is performed at a temperature in a range from about 200 degrees C. to about 230 degrees C. The operation time of the thermal operation may be in a range from about 1 hour to about 3 hours.

Figure 1D:
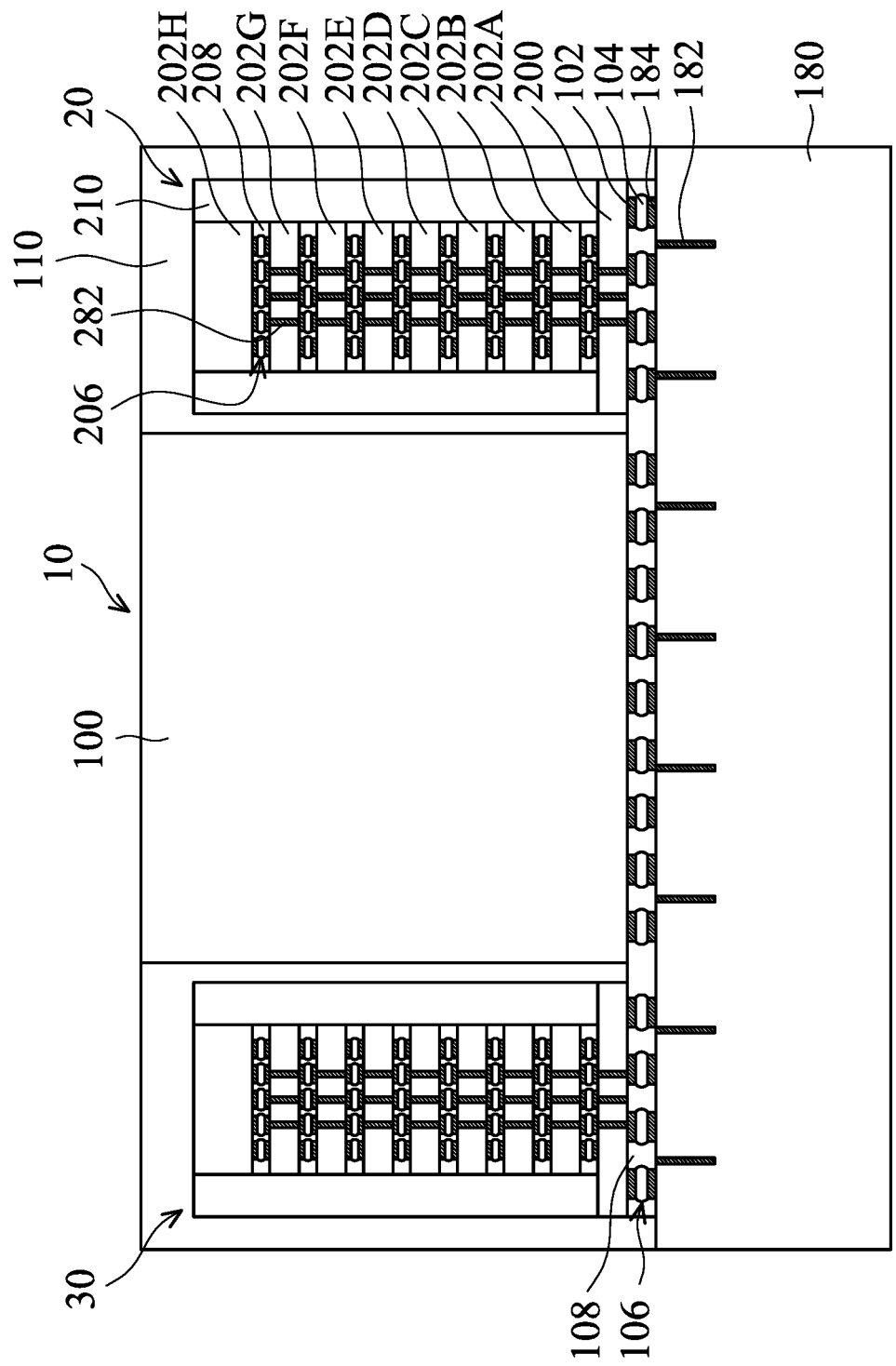

As shown in FIG. 1D, the package layer 110 is planarized such that the top surface of the semiconductor chip 10 is exposed, in accordance with some embodiments. In some embodiments, the top surfaces of the semiconductor chip 10 and the package layer 110 are substantially coplanar with each other. In some embodiments, the package layer 110 is planarized using a grinding process, a chemical mechanical polishing (CMP) process, another applicable process, or a combination thereof. In some embodiments, the top surface of the chip stack 20 or 30 remains covered by the package layer 110. In some embodiments, the chip stacks 20 and 30 are protected by the package layer 110 during the planarization process. The chip stacks 20 and 30 are not ground during the planarization process. Therefore, the chip stacks 20 and 30 are prevented from being damaged during the planarization process. The quality and reliability of the chip stacks 20 and 30 are significantly improved.

In some embodiments, the package layer 110 covers the top and the sidewalls of the chip stacks 20 and 30, as shown in FIG. 1D. In some embodiments, the top surface of the semiconductor chip 10 is not covered by the package layer 110. In some embodiments, the top surface of the package layer 110 is substantially coplanar with the top surface of the semiconductor chip 10, which may facilitate subsequent processes.

Figure 1E:
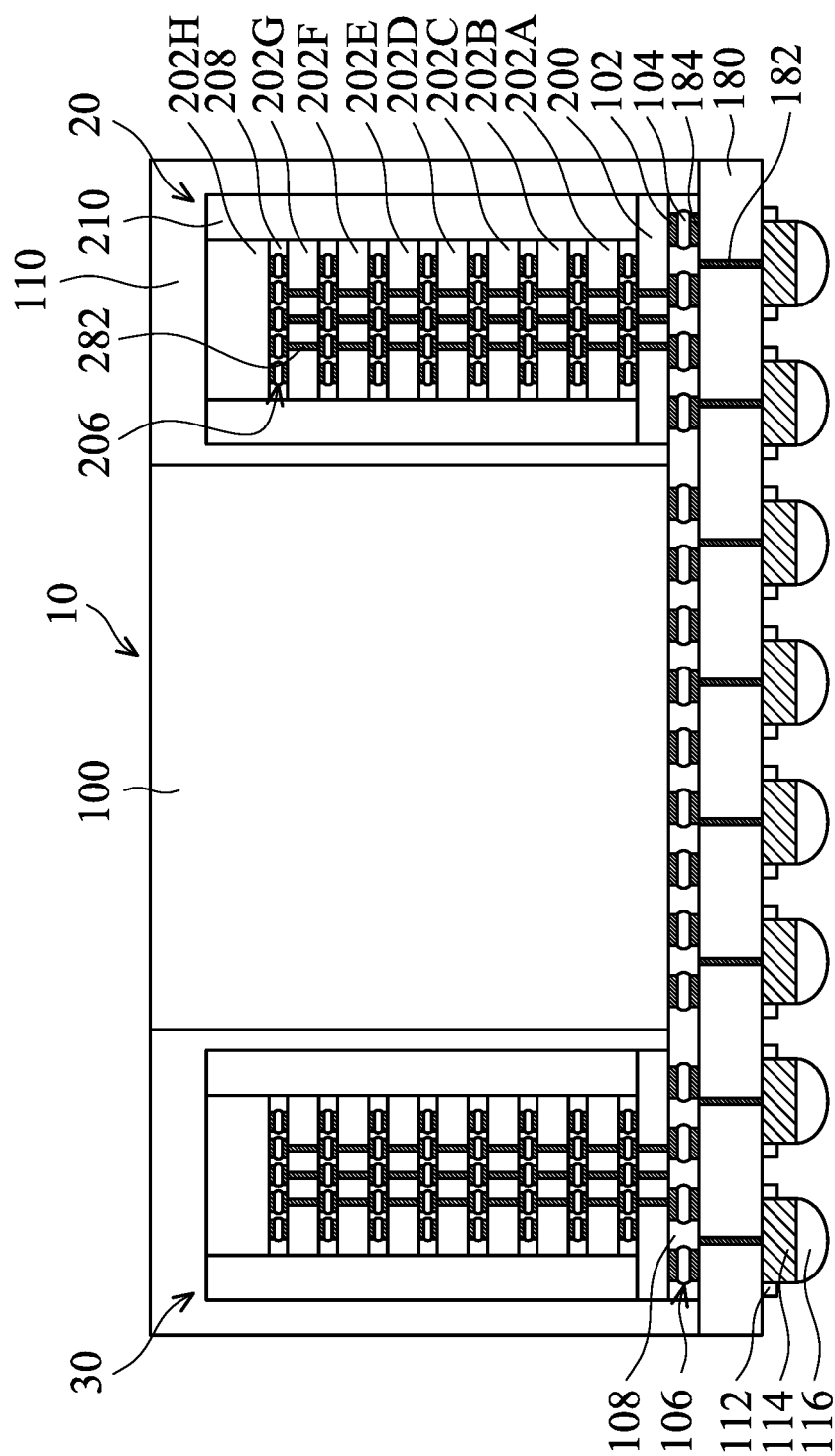

As shown in FIG. 1E, the substrate 180 is thinned to expose the conductive features 182, in accordance with some embodiments. In some embodiments, each of the conductive features 182 penetrates through the substrate 180. In some embodiments, each of the conductive features 182 is electrically connected to one of the conductive bonding structures 106. In some embodiments, the structure shown in FIG. 1D is turned upside down. Afterwards, the substrate 180 is thinned using a planarization process to expose the conductive features 182. The planarization process may include a CMP process, a grinding process, an etching process, another applicable process, or a combination thereof.

Afterwards, conductive elements are formed over the substrate 180, as shown in FIG. 1E in accordance with some embodiments. In some embodiments, the conductive elements include metal pillars 114 and solder elements 116, as shown in FIG. 1E. However, many variations and/or modifications can be made to embodiments of the disclosure. In some other embodiments, the conductive elements have different structures. For example, the conductive elements do not include metal pillars. The conductive elements may only include solder bumps. In some embodiments, a buffer layer 112 is formed to protect the conductive elements. In some embodiments, each of the metal pillars 114 is electrically connected to one of the conductive features 182. In some embodiments, the buffer layer 112 extends along portions of the sidewalls of the metal pillars 114, as shown in FIG. 1E. In some embodiments, the buffer layer 112 is made of silicon nitride, silicon oxynitride, silicon oxide, polyimide, epoxy resin, polybenzoxazole (PBO), another suitable material, or a combination thereof.

Figure 1F:
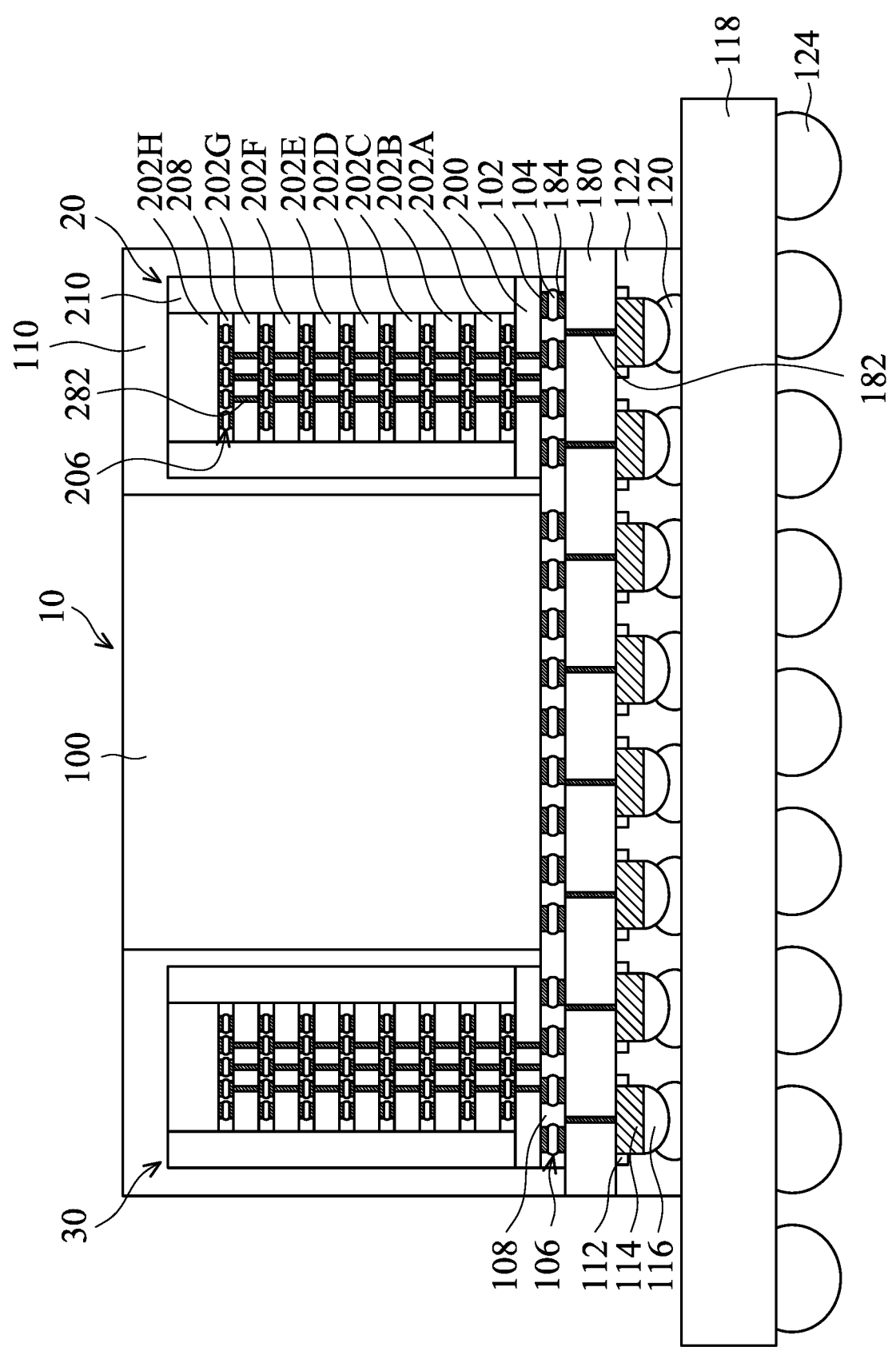

As shown in FIG. 1F, the structure shown in FIG. 1E is bonded onto a substrate 118, in accordance with some embodiments. In some embodiments, the substrate 118 is a circuit board such as a printed circuit board. In some other embodiments, the substrate 118 is a ceramic substrate. In some embodiments, conductive elements 120 and 124 are formed on opposite surfaces of the substrate 118, as shown in FIG. 1F. In some embodiments, the conductive elements 120 and 124 are solder bumps such as controlled collapse chip connection (C4) bumps and/or ball grid array (BGA) bumps. In some embodiments, the conductive elements 120 and the solder elements 116 are reflowed and bonded together, as shown in FIG. 1F.

In some embodiments, each of the conductive elements 120 is electrically connected to one of the conductive elements 124 through conductive features (not shown) formed in the substrate 118. The conductive features may include conductive lines and conductive vias. In some embodiments, an underfill layer 122 is then formed between the substrate 118 and the substrate 180 to protect the conductive bonding structures therebetween.

Figure 2:
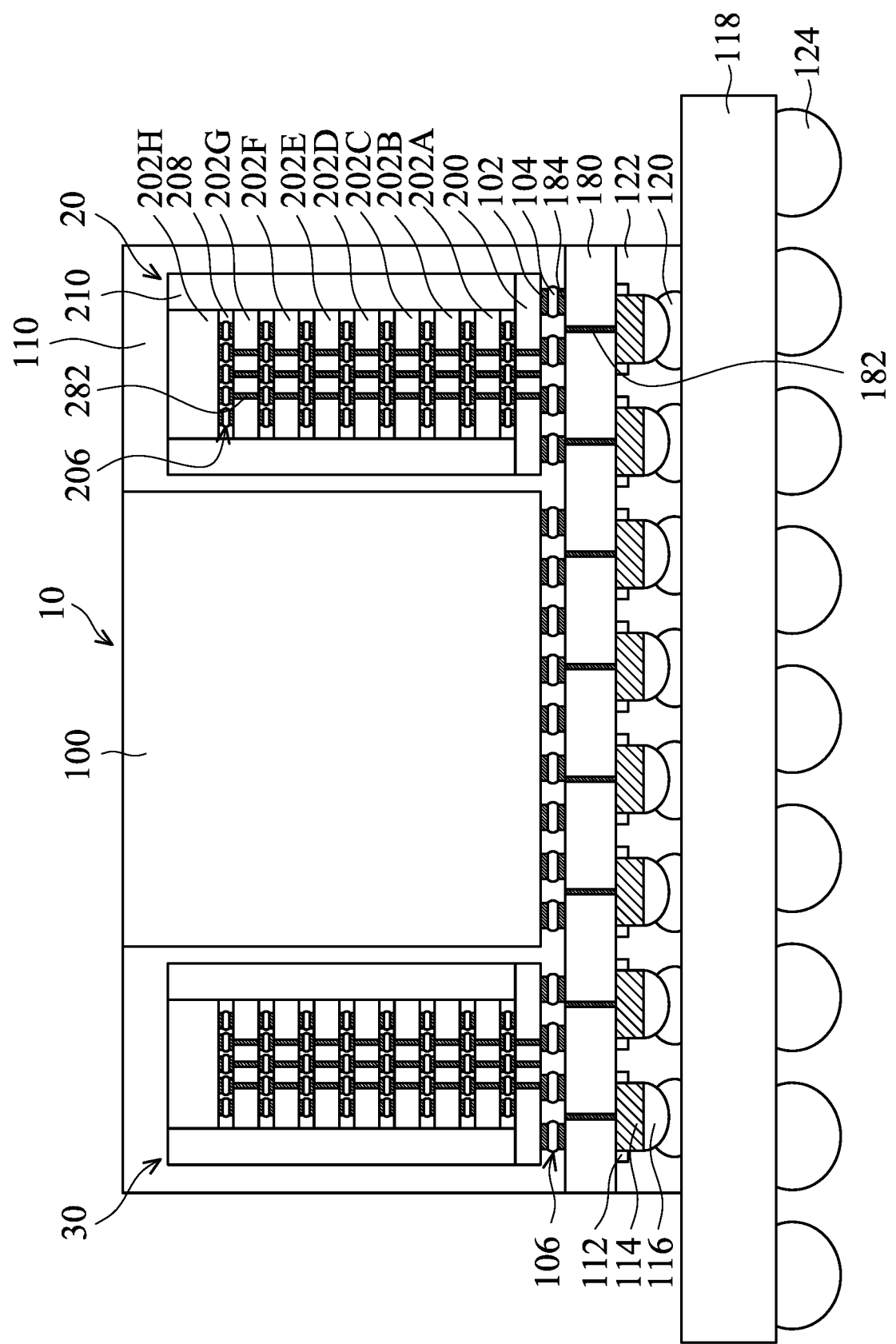
FIG. 2 is a cross-sectional view of a chip package, in accordance with some embodiments.

Many variations and/or modifications can be made to embodiments of the disclosure. FIG. 2 is a cross-sectional view of a chip package, in accordance with some embodiments. In some embodiments, the underfill layer 108 is not formed. In some embodiments, the package layer 110 fills the space between the substrate 180 and the semiconductor chips including the semiconductor chip 10 and the chip stacks 20 and 30. The package layer 110 surrounds the conductive bonding structures 106. In some embodiments, since the underfill layer 108 is not formed, the package layer 110 is in direct contact with the conductive bonding structures 106.

In some embodiments, the substrate 180 is used as an interposer. In some embodiments, the interposer does not include active devices therein. In some other embodiments, the interposer includes one or more active devices formed therein. In some embodiments, the substrate 180 is a silicon interposer. The substrate 180 may be used to improve the structural strength and reliability of the chip package. However, embodiments of the disclosure are not limited thereto. Many variations and/or modifications can be made to embodiments of the disclosure. In some embodiments, the substrate 180 is not formed.

Figure 3A:
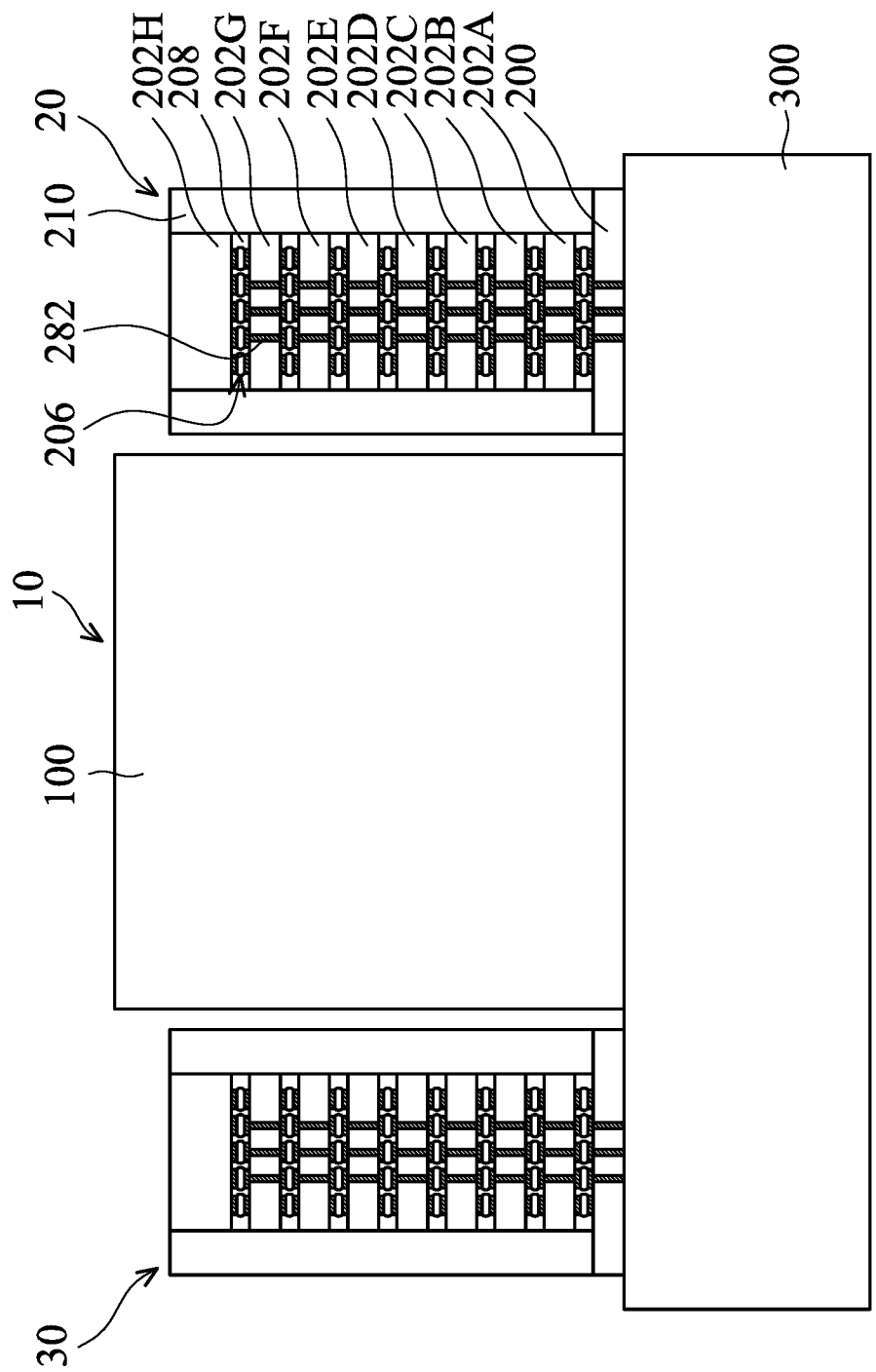
FIGS. 3A-3E are cross-sectional views of various stages of a process for forming a chip package, in accordance with some embodiments.

FIGS. 3A-3E are cross-sectional views of various stages of a process for forming a chip package, in accordance with some embodiments. As shown in FIG. 3A, the semiconductor chip 10 and the chip stacks 20 and 30 are attached on a carrier substrate 300, in accordance with some embodiments. An adhesion layer (not shown) may be used to attach the semiconductor chip 10 and the chip stacks 20 and 30 onto the carrier substrate 300. In some embodiments, the carrier substrate 300 includes a glass substrate, a ceramic substrate, a semiconductor substrate, a polymer substrate, another suitable substrate, or a combination thereof. In some embodiments, the carrier substrate 300 is a temporary substrate to support the semiconductor chip 10 and the chip stacks 20 and 30 during subsequent processes. Afterwards, the carrier substrate 300 may be removed.

Figure 3B:
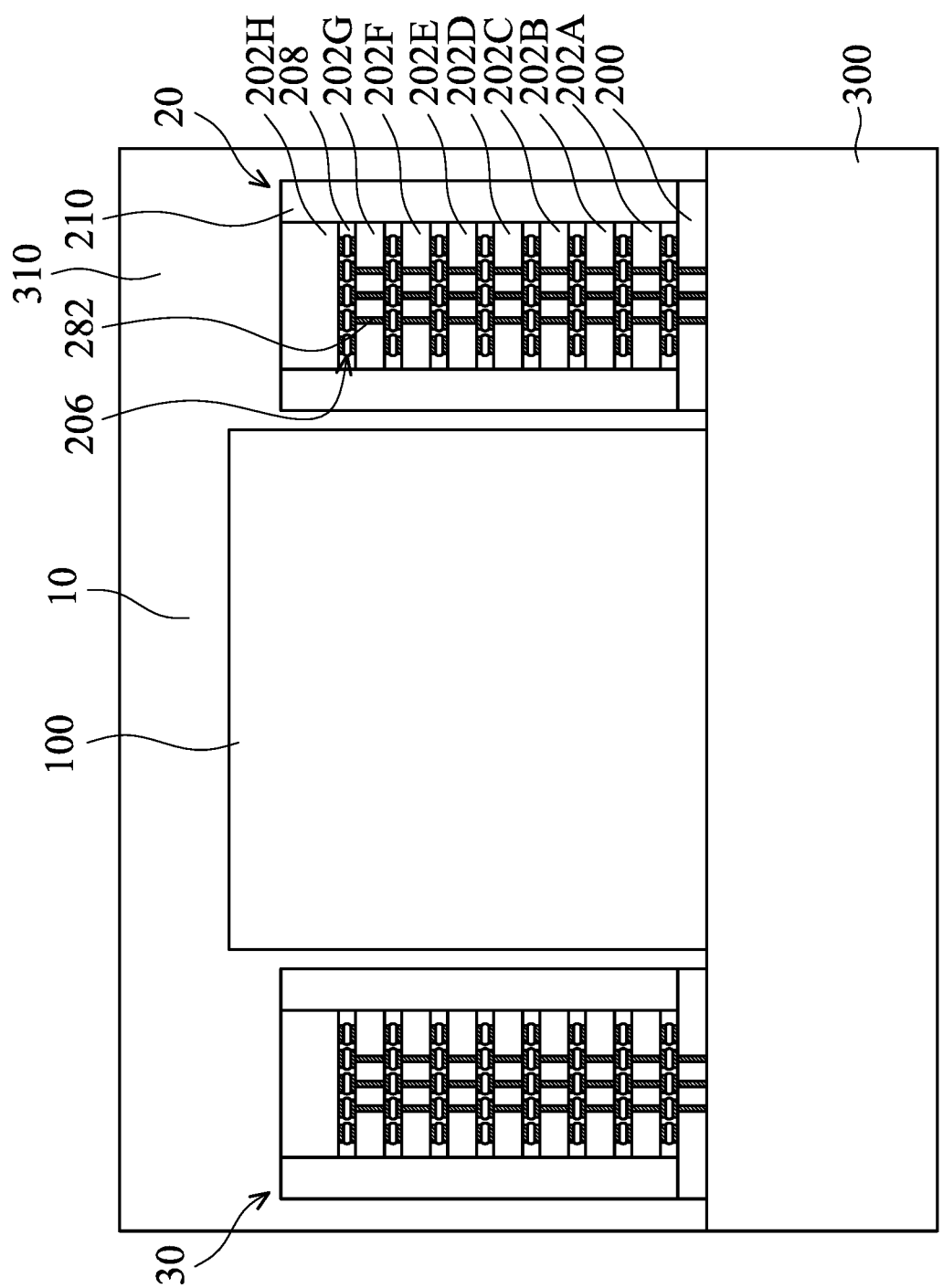

As shown in FIG. 3B, a package layer 310 is formed over the carrier substrate 300 to encapsulate the semiconductor chip 10 and the chip stacks 20 and 30, in accordance with some embodiments. In some embodiments, the package layer 310 fills gaps between the semiconductor chip 10 and the chip stack 20 or 30. In some embodiments, the package layer 310 is in direct contact with the molding compound layers 210 of the chip stacks 20 and 30.

In some embodiments, the package layer 310 includes a polymer material. In some embodiments, the package layer 310 is a molding compound layer. The molding compound layer may include an epoxy-based resin with fillers dispersed therein. The fillers may include insulating fibers, insulating particles, other suitable elements, or a combination thereof.

In some embodiments, a liquid molding compound material is applied, and a thermal operation is then applied to cure the liquid molding compound material. As a result, the liquid molding compound material is hardened and transformed into the package layer 310. In some embodiments, the thermal operation is performed at a temperature in a range from about 200 degrees C. to about 230 degrees C. The operation time of the thermal operation may be in a range from about 1 hour to about 3 hours.

Figure 3C:
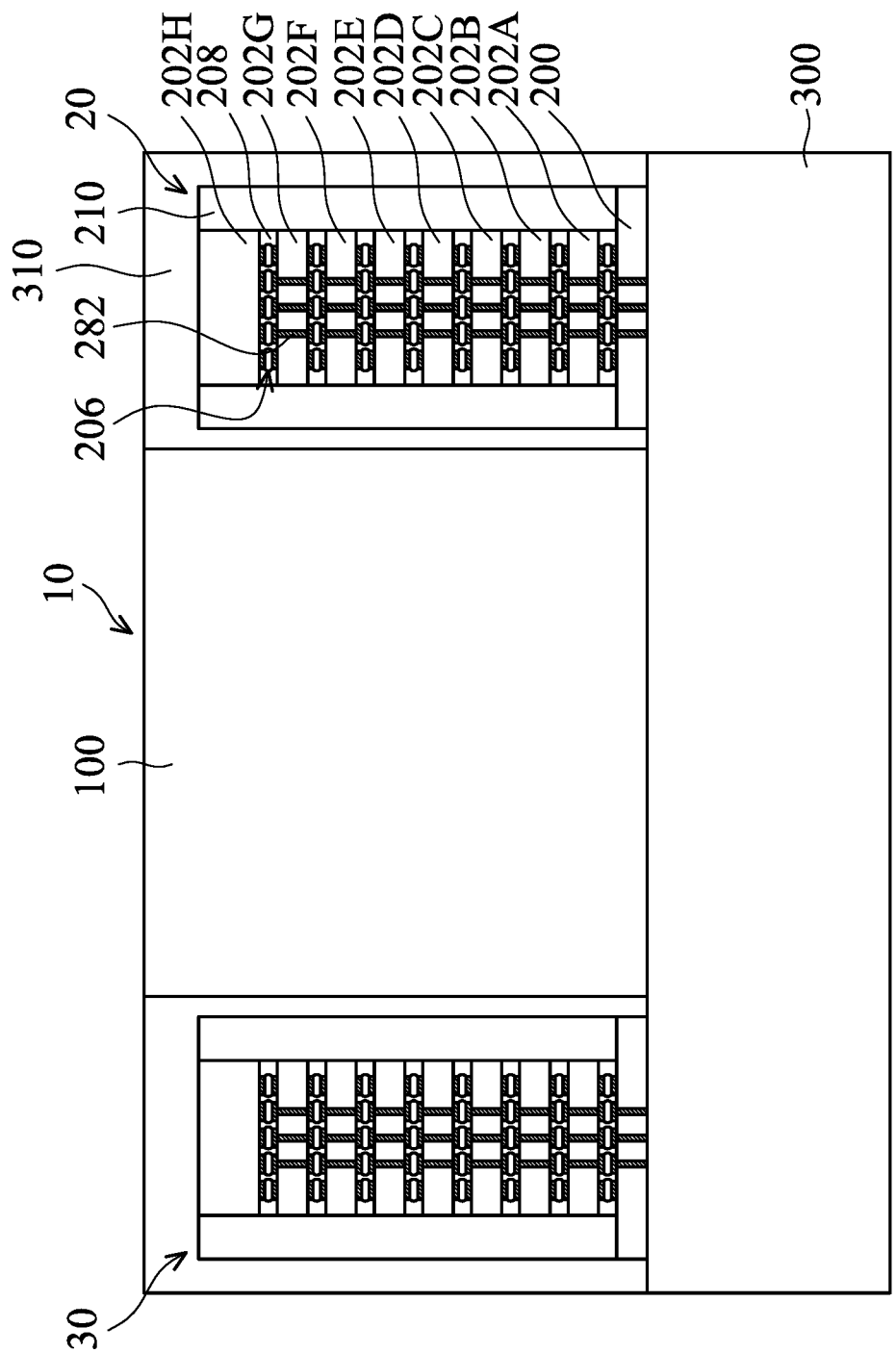

As shown in FIG. 3C, the package layer 310 is planarized so that the top surface of the semiconductor chip 10 is exposed, in accordance with some embodiments. In some embodiments, the package layer 310 is planarized using a grinding process, a chemical mechanical polishing (CMP) process, another applicable process, or a combination thereof. In some embodiments, the top surface of the chip stack 20 or 30 remains covered by the package layer 310. In some embodiments, the chip stacks 20 and 30 are protected by the package layer 310 during the planarization process. The chip stacks 20 and 30 are not ground during the planarization process. Therefore, the chip stacks 20 and 30 are prevented from being damaged during the planarization process. The quality and reliability of the chip stacks 20 and 30 are significantly improved.

In some embodiments, the package layer 310 covers the top and the sidewalls of the chip stacks 20 and 30, as shown in FIG. 3C. In some embodiments, the top surface of the semiconductor chip 10 is not covered by the package layer 310. In some embodiments, the top surface of the package layer 310 is substantially coplanar with the top surface of the semiconductor chip 10, which may facilitate subsequent processes.

Figure 3D:
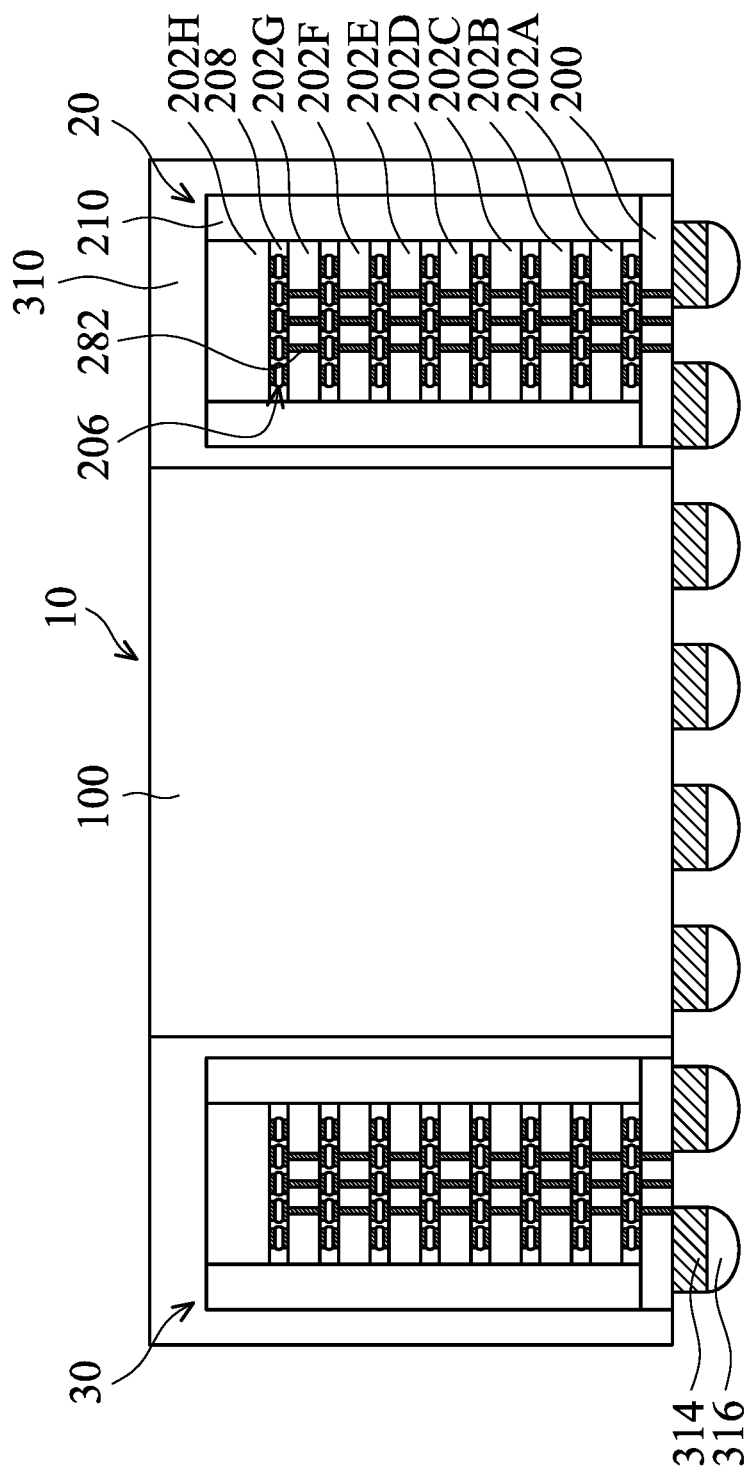

As shown in FIG. 3D, the carrier substrate 300 is removed such that the bottom surfaces of the semiconductor chip 10, the chip stacks 20 and 30, and the package layer 310 are exposed, in accordance with some embodiments. In some embodiments, the bottom surfaces of the semiconductor chip 10, the chip stacks 20 and 30, and the package layer 310 are substantially coplanar with each other.

Afterwards, conductive elements are formed over the bottom surfaces of the semiconductor chip 10 and the chip stacks 20 and 30, as shown in FIG. 3D in accordance with some embodiments. In some embodiments, the conductive elements include metal pillars 314 and solder elements 316, as shown in FIG. 1E. In some other embodiments, the conductive elements include other configurations. In some embodiments, a buffer layer (not shown) is formed to protect the conductive elements.

Figure 3E:
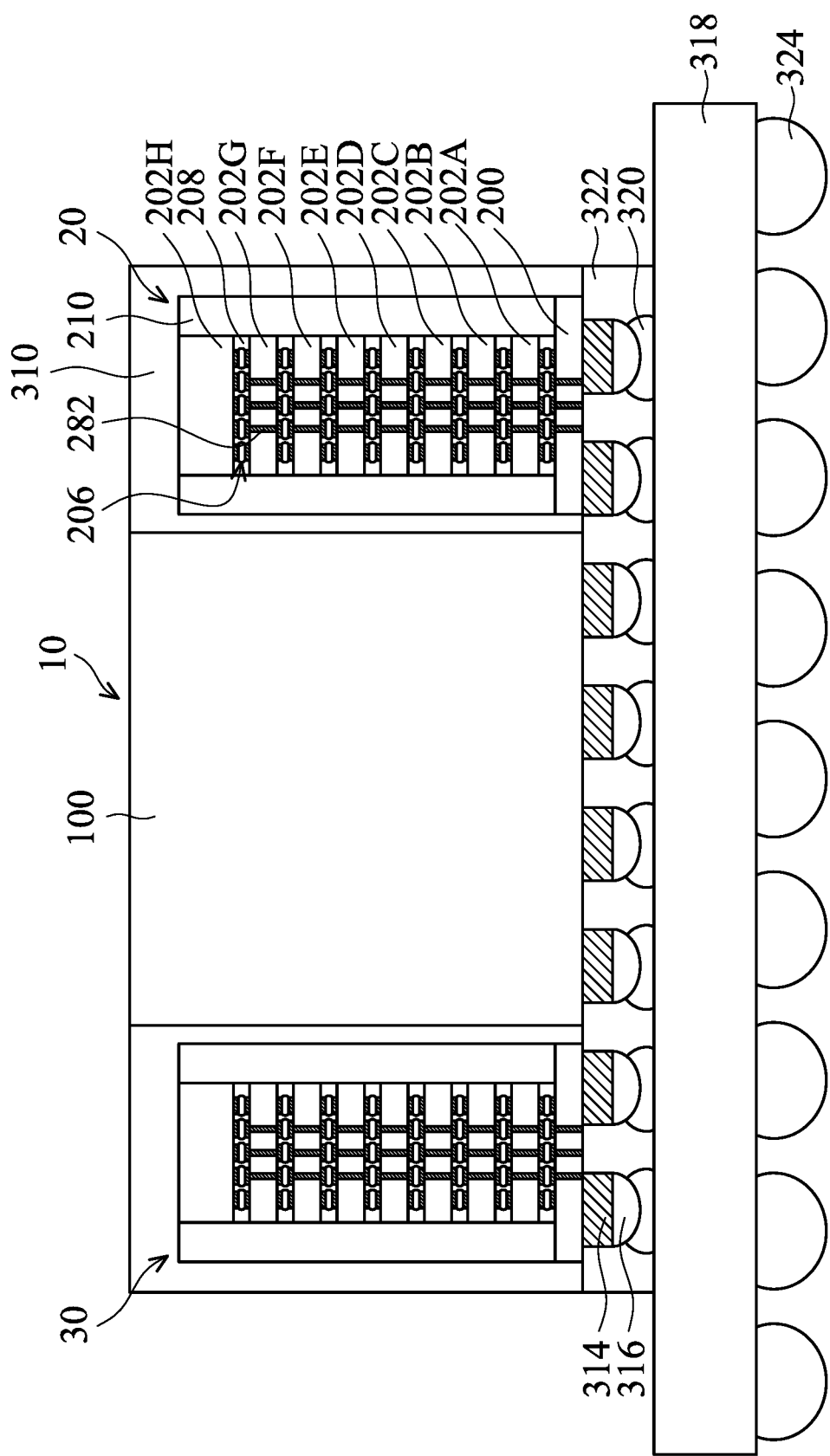

As shown in FIG. 3E, the structure shown in FIG. 3D is bonded onto a substrate 318, in accordance with some embodiments. In some embodiments, the substrate 318 is a circuit board such as a printed circuit board. In some other embodiments, the substrate 318 is a ceramic substrate. In some embodiments, conductive elements 320 and 324 are formed on opposite surfaces of the substrate 318, as shown in FIG. 3E. In some embodiments, the conductive elements 320 and 324 are solder bumps such as controlled collapse chip connection (C4) bumps and/or ball grid array (BGA) bumps. In some embodiments, the conductive elements 320 and the solder elements 316 are reflowed and bonded together, as shown in FIG. 3E.

In some embodiments, each of the conductive elements 320 is electrically connected to one of the conductive elements 324 through conductive features (not shown) formed in the substrate 318. The conductive features may include conductive lines and conductive vias. In some embodiments, an underfill layer 322 is then formed between the substrate 318 and the chips including the semiconductor chip 10 and the chip stacks 20 and 30 to protect the conductive bonding structures therebetween. In some embodiments, the package layer 310 is not in direct contact with the conductive bonding structures therebetween.

In some embodiments, due to the protection of the package layer 310, the chip stacks 20 and 30 are prevented from being damaged during the fabrication processes. For example, the stress generated from the planarization of the package layer 310 and the bonding process to the substrate 318 is buffered. The quality of the chip package is improved.

Figure 4:
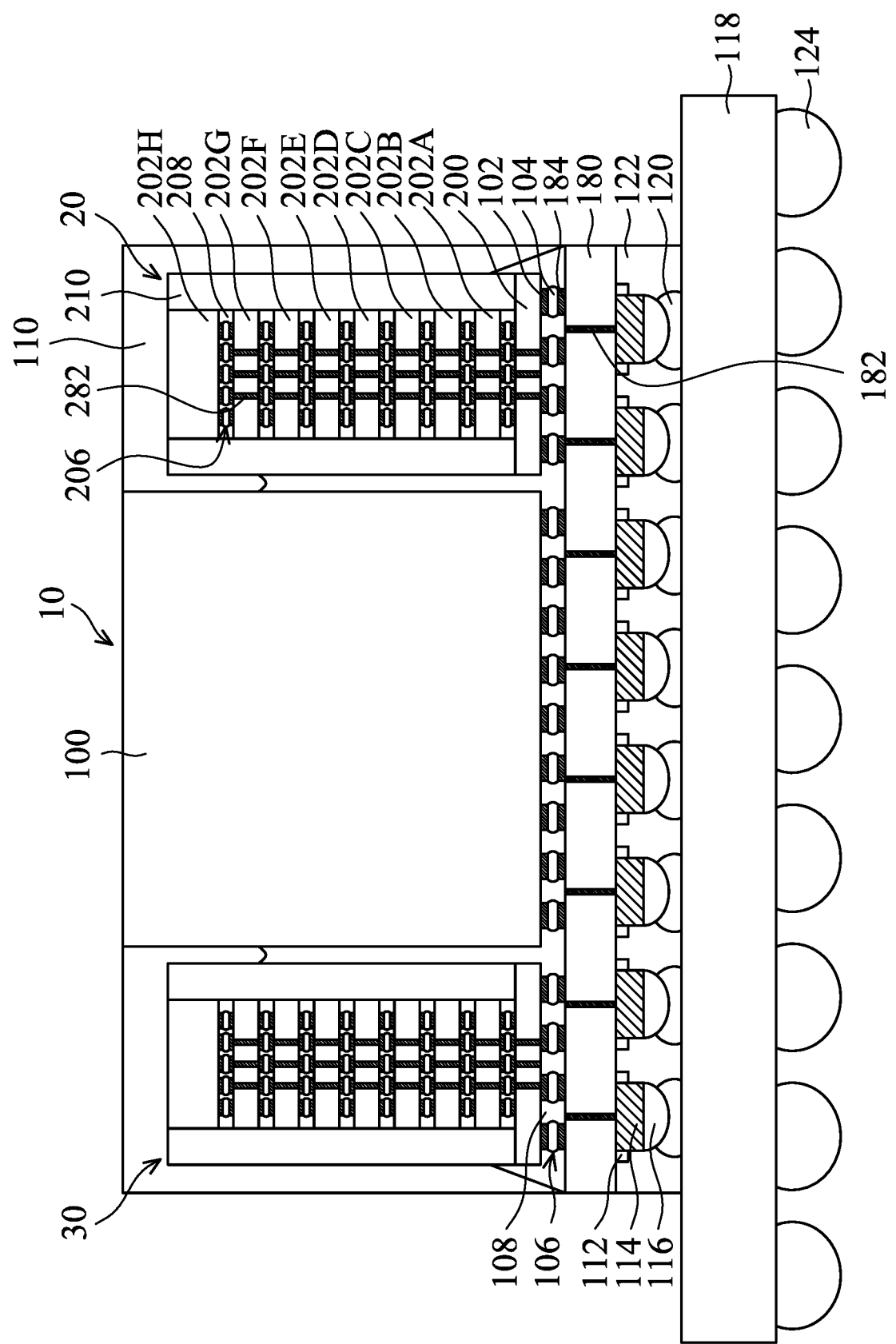
FIG. 4 is a cross-sectional view of a chip package, in accordance with some embodiments.

Many variations and/or modifications can be made to embodiments of the disclosure. FIG. 4 is a cross-sectional view of a chip package, in accordance with some embodiments. In some embodiments, the underfill layer 108 not only surrounds the conductive bonding structures 106 but further extends on sidewalls of the semiconductor chip 10. Portions of the sidewalls of the semiconductor chip 10 are covered by the underfill layer 108. In some embodiments, the underfill layer 108 extends on the chip stacks 20 and 30. Portions of the sidewalls of the chip stacks 20 and 30 are covered by the underfill layer 108.

Figure 5:
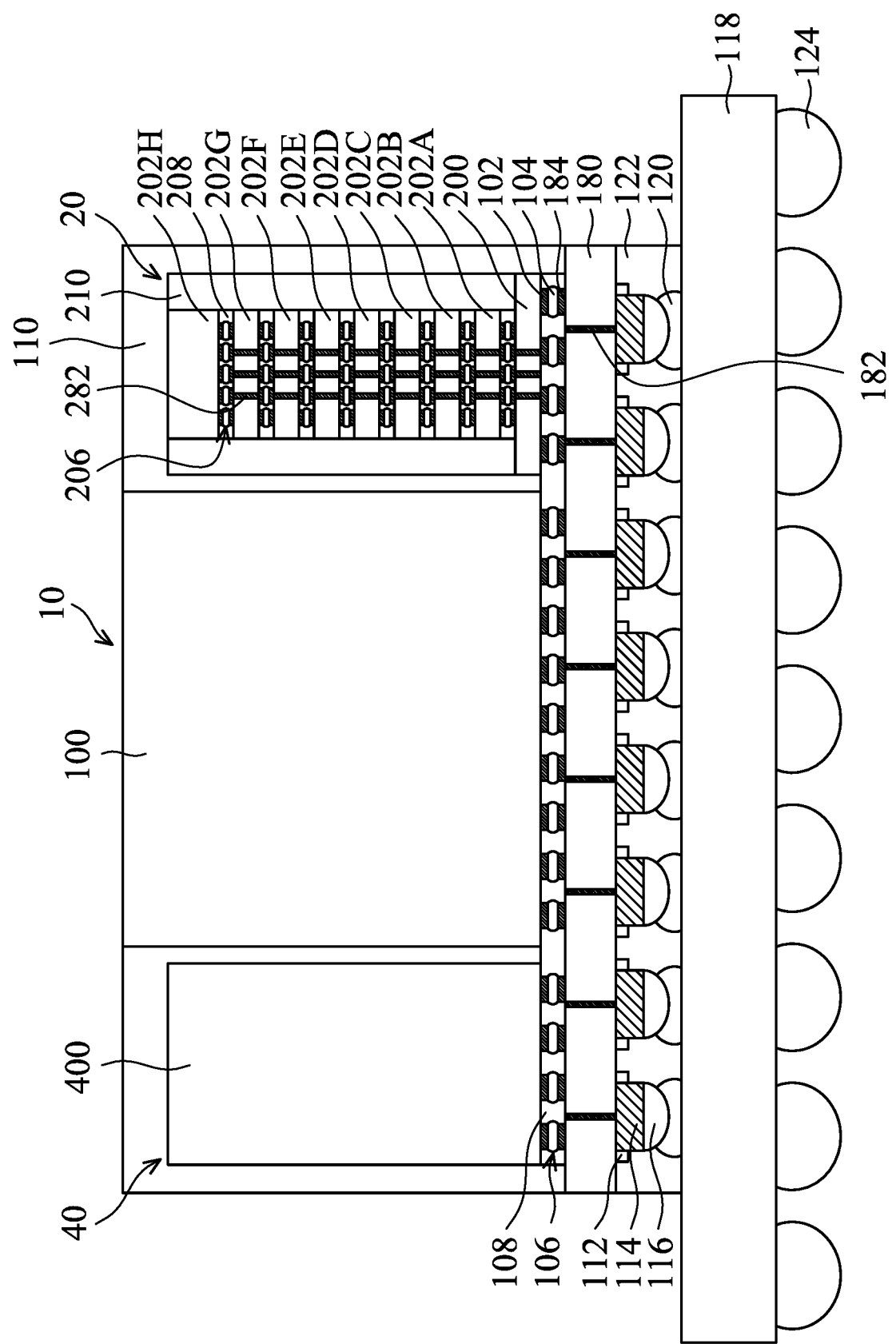
FIG. 5 is a cross-sectional view of a chip package, in accordance with some embodiments.

Many variations and/or modifications can be made to embodiments of the disclosure. FIG. 5 is a cross-sectional view of a chip package, in accordance with some embodiments. The structure shown in FIG. 5 is similar to that shown in FIG. 1F. In some embodiments, the semiconductor chip 10 is positioned between the chip stack 20 and a semiconductor chip 40. In some embodiments, the semiconductor chip 10 is higher than the chip stack 20 or the semiconductor chip 40. In some embodiments, the heights of the semiconductor chip 40 and the chip stack 20 are different from each other. In some embodiments, the semiconductor chip 40 is higher than the chip stack 20.

In some embodiments, the semiconductor chip 40 includes a semiconductor substrate 400 and an interconnection structure (not shown) formed on the semiconductor substrate 400. For example, the interconnection structure is formed on a bottom surface of the semiconductor substrate 400. The interconnection structure includes multiple interlayer dielectric layers and multiple conductive features formed in the interlayer dielectric layers. These conductive features include conductive lines, conductive vias, and conductive contacts. Some portions of the conductive features may be used as conductive pads.

In some embodiments, similar to the semiconductor substrate 100, various device elements are formed in the semiconductor substrate 400. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected through the interconnection structure to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor chip 40 is a system-on-chip (SoC) chip that includes multiple functions. In some embodiments, one or more of the functions of the semiconductor chips 10 and 40 are different from each other.

Figure 6:
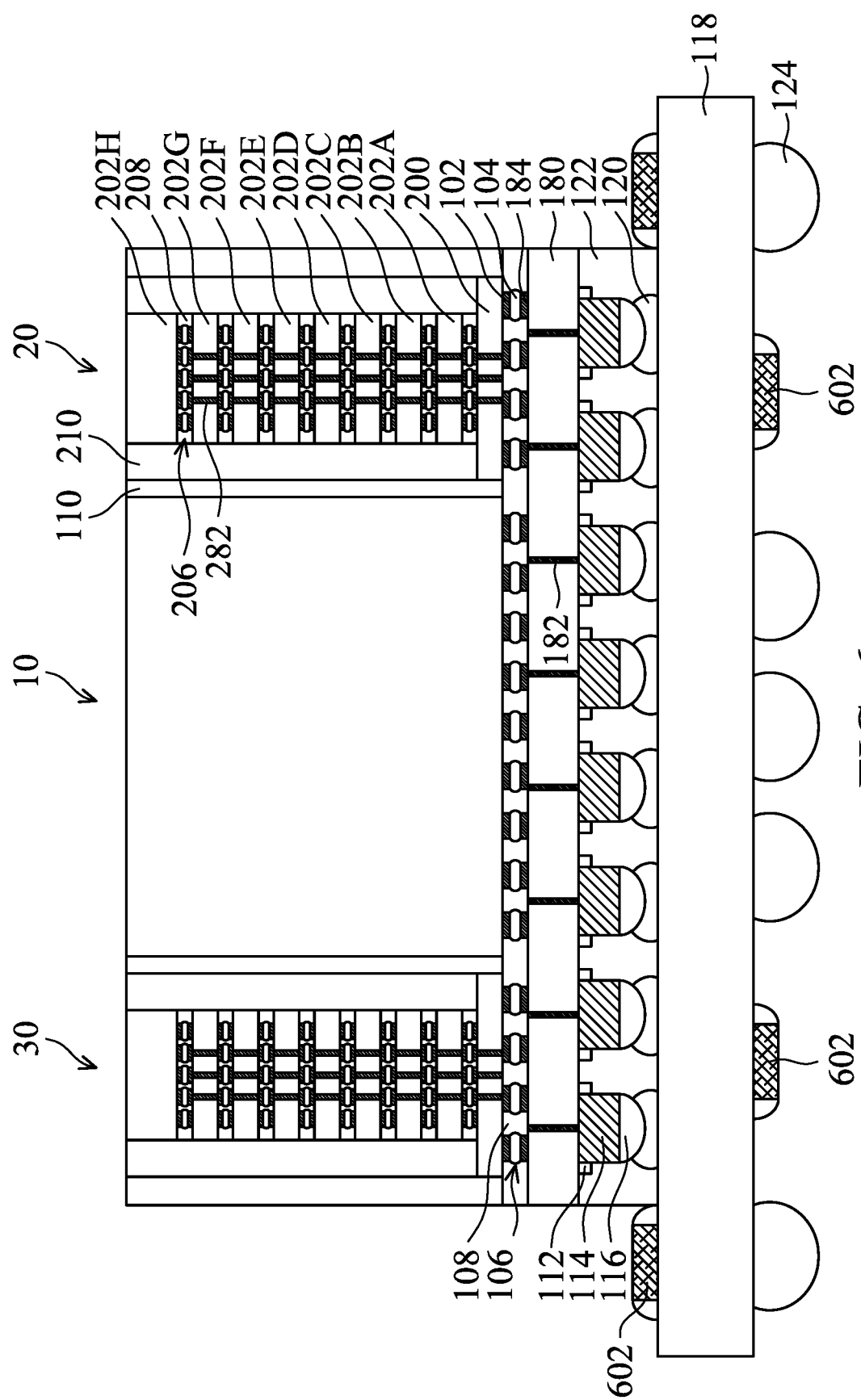
FIG. 6 is a cross-sectional view of a chip package, in accordance with some embodiments.

Many variations and/or modifications can be made to embodiments of the disclosure. FIG. 6 is a cross-sectional view of a chip package, in accordance with some embodiments. The structure shown in FIG. 6 is similar to that shown in FIG. 1F. In some embodiments, the package layer 110 and the semiconductor chip 10 are planarized such that the top surfaces of the chip stacks 20 and 30 are exposed. In some embodiments, the top surface of the semiconductor chip 10, the top surface of the package layer 110 and the top surfaces of the chip stacks 20 and 30 are substantially coplanar with each other. In some embodiments, the package layer 110 and the semiconductor chip 10 are planarized using a grinding process, a CMP process, an etching process, another applicable process, a combination thereof, or the like. In some embodiments, surface mount devices (SMDs) 602 are bonded to a top surface and/or to a bottom surface of the substrate 118. The SMDs 602 may comprise discrete passive and/or active devices and may provide additional functionality to the chip package shown in FIG. 6.

Figure 7:
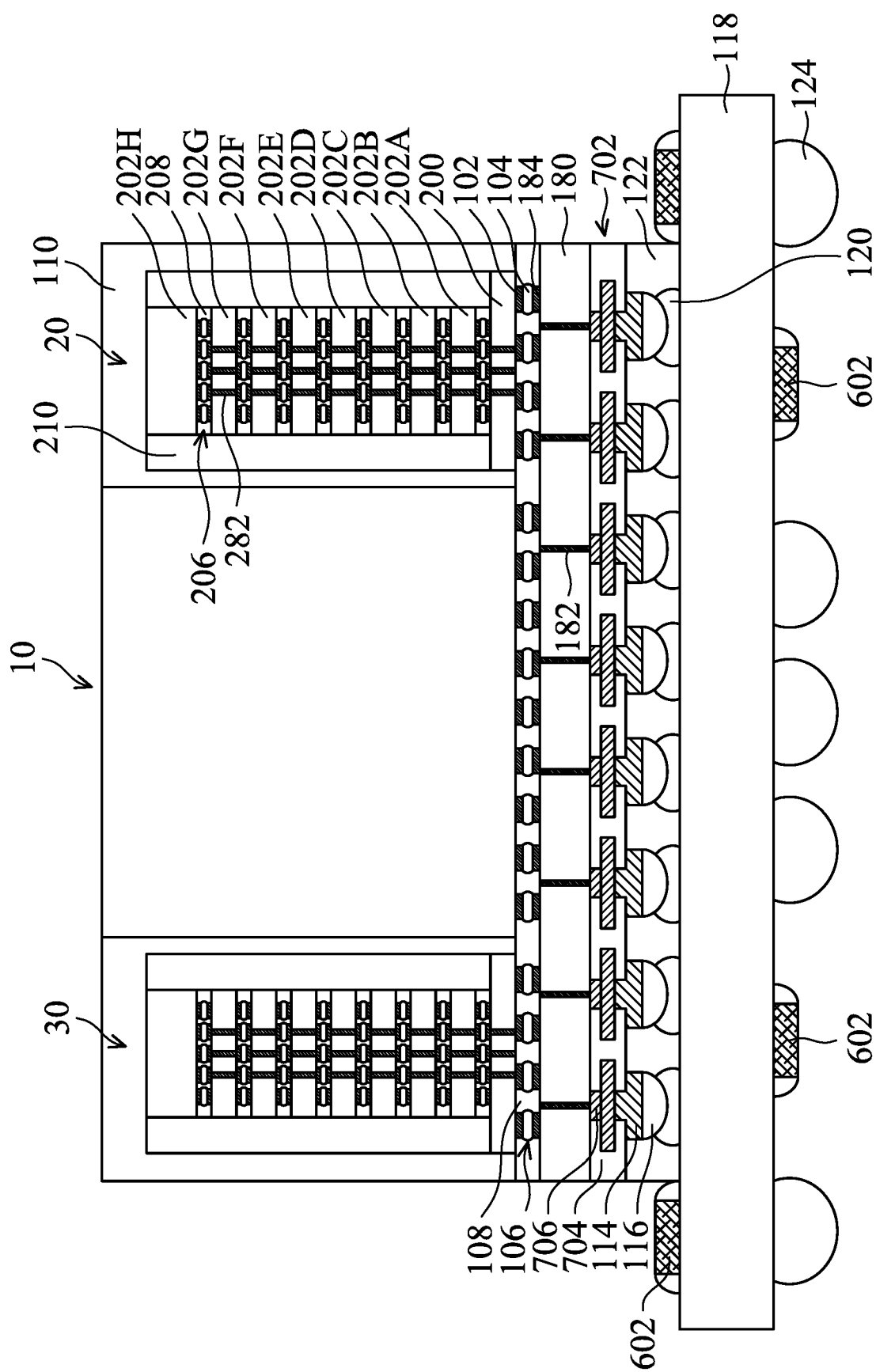
FIG. 7 is a cross-sectional view of a chip package, in accordance with some embodiments.

Many variations and/or modifications can be made to embodiments of the disclosure. FIG. 7 is a cross-sectional view of a chip package, in accordance with some embodiments. The structure shown in FIG. 7 is similar to that shown in FIG. 1F. In some embodiments, after thinning the substrate 180 and before forming the metal pillars 114 and the solder elements 116, a redistribution structure 702 is formed in electrical contact with the conductive features 182. In some embodiments, the redistribution structure 702 comprises a plurality of insulating layers 704 (not individually shown) and a plurality of redistribution layers (RDLs) 706 within and/or between the plurality of insulating layers 704. In some embodiments, the RDLs 706 comprise conductive lines and conductive vias (not individually labeled).

In some embodiments, the insulating layers 704 may comprise photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material, for example. In such embodiments, the RDLs 706 may be formed using a first RDL formation method. In some embodiments, the first RDL formation method may comprise patterning an insulator layer of the insulating layers 704 to form openings therein. A seed layer is blanket formed over the insulating layer and in the openings. In some embodiments, the seed layer may comprise one or more layers of copper, titanium, nickel, gold, manganese, a combination thereof, or the like, and may be formed by atomic layer deposition (ALD), physical vapor deposition (PVD), sputtering, a combination thereof, or the like. A sacrificial layer (such as, for example, a photoresist layer) is formed over the seed layer and is patterned to expose portions of the seed layer in the openings in the insulating layer and portions of the seed layer over a top surface of the insulating layer. A conductive material is formed in combined openings formed of the openings in the patterned insulation layer and openings in the patterned sacrificial layer. In some embodiments, the conductive material may comprise copper, tungsten, aluminum, silver, gold, a combination thereof, or the like, and may be formed using an electro-chemical plating process, an electroless plating process, ALD, PVD, a combination thereof, or the like. After forming the conductive material, the sacrificial layer is removed. Subsequently, exposed portions of the seed layer are removed using, for example, an etching method, or the like. In some embodiments, this process may be repeated to form additional RDLs until the desired number of RDLs is formed.

In other embodiments, the plurality of insulating layers 704 may comprise non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using chemical vapor deposition (CVD), ALD, a spin-on coating process, a combination thereof, or the like. In such embodiments, the RDLs 706 may be formed using a second RDL formation method. The second RDL formation method may comprise a single damascene process, a dual damascene process, a combination thereof, or the like.

In yet other embodiments, first insulating layers of the insulating layers 704 adjacent to the bottom surface of the substrate 180 may comprise non-photo-patternable insulating materials, while second insulating layers of the insulating layers 704 adjacent the metal pillars 114 may comprise photo-patternable insulating materials. In such embodiments, the RDLs 706 are formed using the second RDL formation method within and/or between the first insulating layers and using the first RDL formation method within and/or between the second insulating layers.

In the embodiment illustrated in FIG. 7, the top surface of the semiconductor chip 10 and the top surface of the package layer 110 are substantially coplanar with each other. In other embodiments, the top surface of the semiconductor chip 10, the top surface of the package layer 110 and the top surfaces of the chip stacks 20 and 30 are substantially coplanar with each other, such as described above with reference to FIG. 6.

Figure 8:
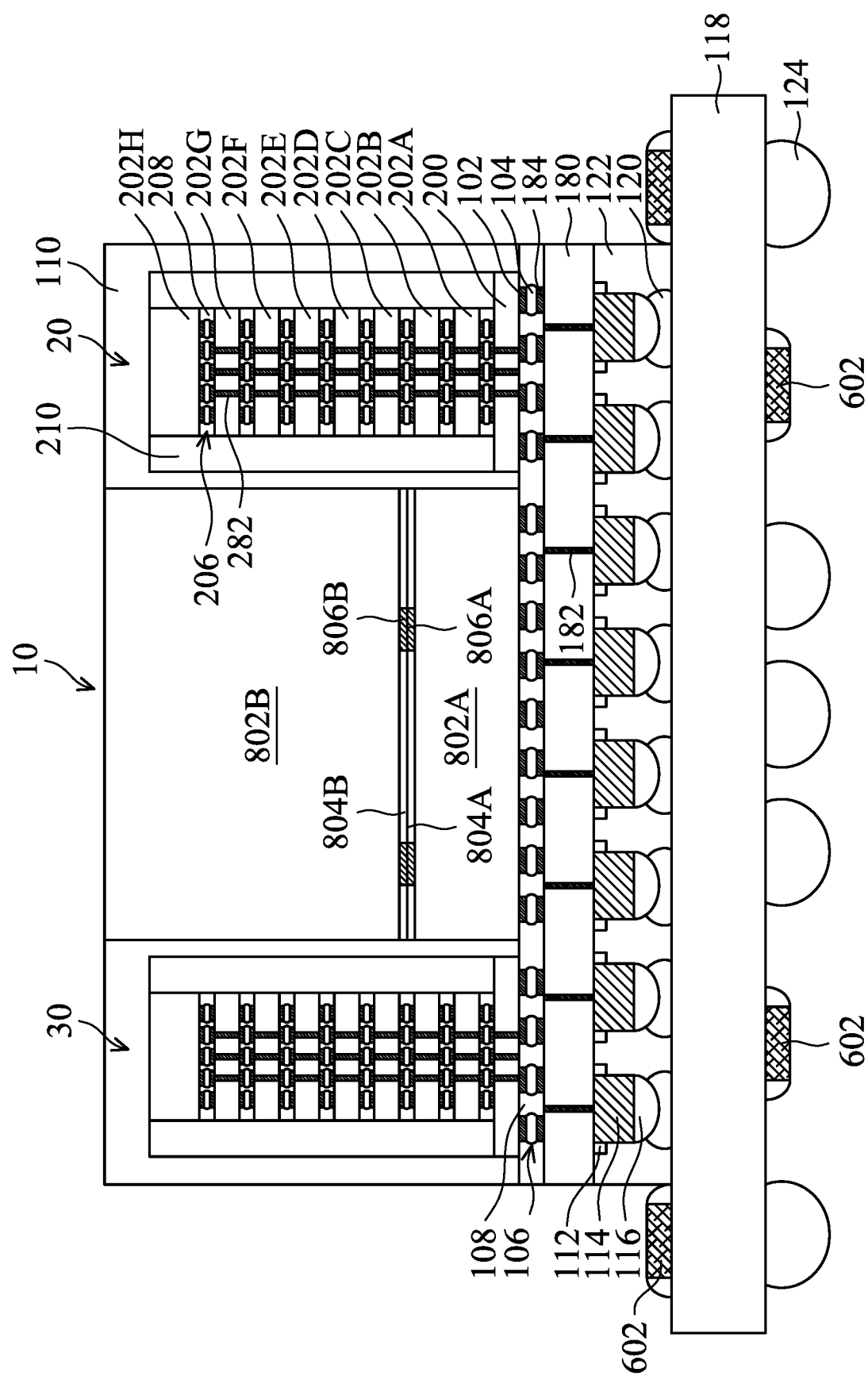
FIG. 8 is a cross-sectional view of a chip package, in accordance with some embodiments.

Many variations and/or modifications can be made to embodiments of the disclosure. FIG. 8 is a cross-sectional view of a chip package, in accordance with some embodiments. The structure shown in FIG. 8 is similar to that shown in FIG. 1F. In some embodiments, the semiconductor chip 10 comprises a multi-die stack. In the illustrated embodiments, the semiconductor chip 10 comprises two integrated circuit dies 802A and 802B. In other embodiments, the number of integrated circuit dies may vary according the design requirements of the chip package. In some embodiments, dies 802A and 802B may be formed using similar materials and methods as, for example, the semiconductor chip 40 described above with reference to FIG. 5, and the description is not repeated herein. In some embodiments, the dies 802A and 802B are bonded to one another using a direct bonding method, such as a hybrid bonding method, or the like. In such embodiments, an insulating layer 804A of the die 802A is direct bonded to an insulating layer 804B of the die 802B, and bond pads 806A of die 802A are direct bonded to bond pads 806B of the die 802B. In some embodiments, surface treatment processes may be performed on exposed surfaces of the insulating layers 804A and 804B, and exposed surfaces of the bond pads 806A and 806B prior to bonding the die 802A to the die 802B. In some embodiments, after bonding the die 802A to the die 802B, an annealing process may be performed to strengthen the bond between the die 802A to the die 802B. In some embodiments, the bonds between the bond pads 806A and 806B provide electrical connections between the die 802A and the die 802B. In some embodiments, the bond pads 806A and 806B may comprise copper, tungsten, aluminum, silver, gold, a combination thereof, or the like. In some embodiments, the bond pads 806A and 806B may comprise a same material. In other embodiments, the bond pads 806A and 806B may comprise different materials. In some embodiments, the insulating layers 804A and 804B may be formed using similar materials and methods as the insulating layers 704 described above with reference to FIG. 7, and the description is not repeated herein. In some embodiments, the insulating layers 804A and 804B may comprise a same material. In other embodiments, the insulating layers 804A and 804B may comprise different materials.

In the embodiment illustrated in FIG. 8, the top surface of the semiconductor chip 10 and the top surface of the package layer 110 are substantially coplanar with each other. In other embodiments, the top surface of the semiconductor chip 10, the top surface of the package layer 110 and the top surfaces of the chip stacks 20 and 30 are substantially coplanar with each other, such as described above with reference to FIG. 6. In some embodiments, the semiconductor chips 10 illustrated in FIGS. 1F, 2, 3E, 4 and 5 are multi-die stacks as described above with reference to FIG. 8.

Figure 9:
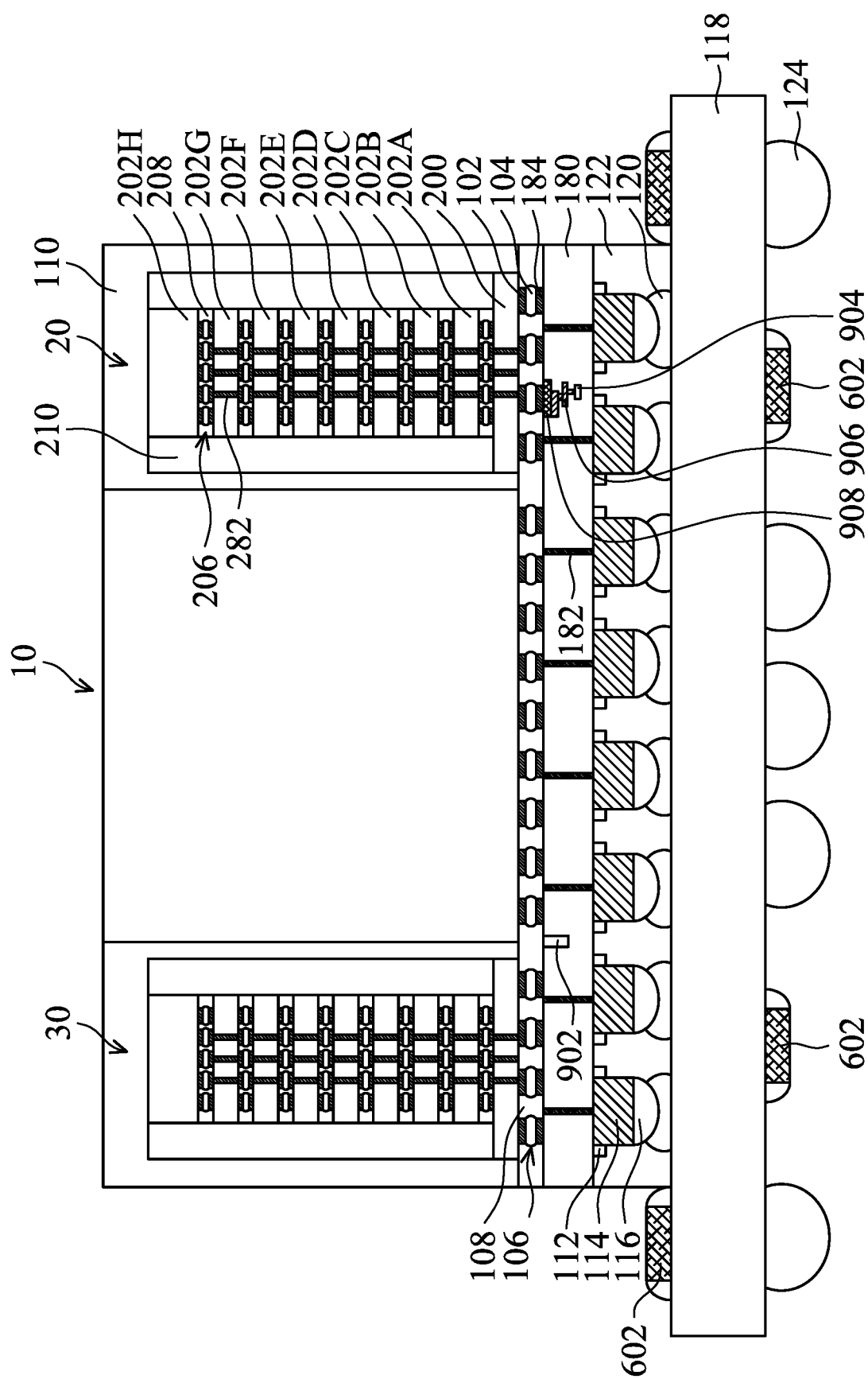
FIG. 9 is a cross-sectional view of a chip package, in accordance with some embodiments.

Many variations and/or modifications can be made to embodiments of the disclosure. FIG. 9 is a cross-sectional view of a chip package, in accordance with some embodiments. The structure shown in FIG. 9 is similar to that shown in FIG. 1F. In some embodiments, the substrate 180 may comprise one or more passive devices 902 and one or more active devices 904. The passive devices 902 may comprise resistors, capacitors (such as, for example, deep trench capacitors), inductors, fuses, combinations thereof, or the like. The active devices 904 may comprise transistors, diodes, photo-diodes, optical couplers, modulators, combinations thereof, or the like. In some embodiments, the active devices 904 may be electrically coupled to the conductive bonding structures 106 through interconnects 906 (such as conductive lines and vias) and contact pads 908. In some embodiments, the interconnects 906 and the contact pads 908 may comprise copper, tungsten, aluminum, silver, gold, a combination thereof, or the like. In other embodiments, one of the passive devices 902 and the active devices 904 may be omitted.

In the embodiment illustrated in FIG. 9, the top surface of the semiconductor chip 10 and the top surface of the package layer 110 are substantially coplanar with each other. In other embodiments, the top surface of the semiconductor chip 10, the top surface of the package layer 110 and the top surfaces of the chip stacks 20 and 30 are substantially coplanar with each other, such as described above with reference to FIG. 6.

Figure 10:
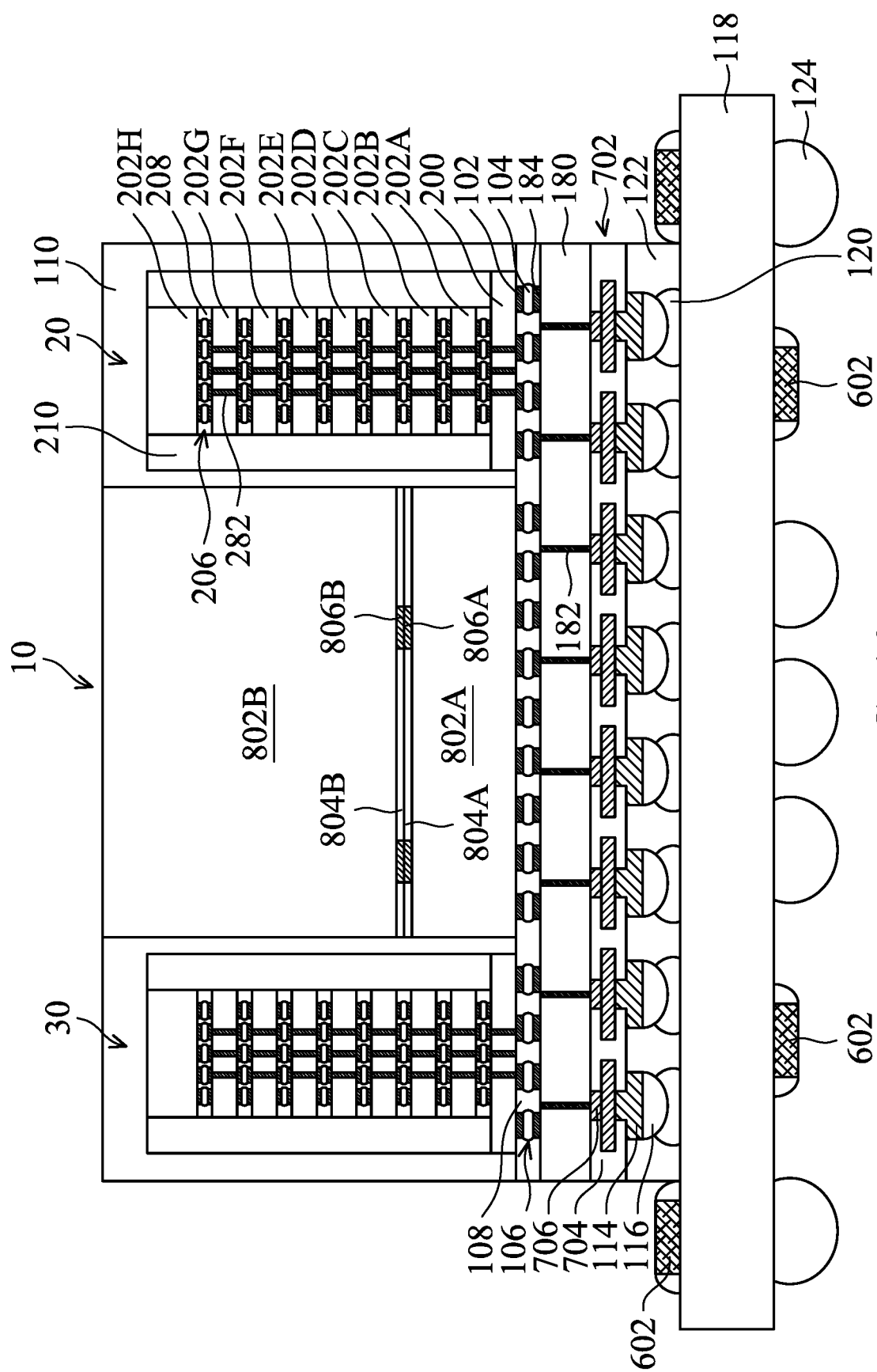
FIG. 10 is a cross-sectional view of a chip package, in accordance with some embodiments.

Many variations and/or modifications can be made to embodiments of the disclosure. FIG. 10 is a cross-sectional view of a chip package, in accordance with some embodiments. The structure shown in FIG. 10 is similar to that shown in FIG. 1F. In some embodiments, the chip package comprises a redistribution structure 702 between the substrate 180 and the metal pillars 114. The redistribution structure 702 has been described above with reference to FIG. 7, and the description is not repeated herein. In some embodiments, the semiconductor chip 10 comprises a multi-die stack comprising integrated circuit dies 802A and 802B. The multi-die stack has been described above with reference to FIG. 8, and the description is not repeated herein.

In the embodiment illustrated in FIG. 10, the top surface of the semiconductor chip 10 and the top surface of the package layer 110 are substantially coplanar with each other. In other embodiments, the top surface of the semiconductor chip 10, the top surface of the package layer 110 and the top surfaces of the chip stacks 20 and 30 are substantially coplanar with each other, such as described above with reference to FIG. 6.

Figure 11:
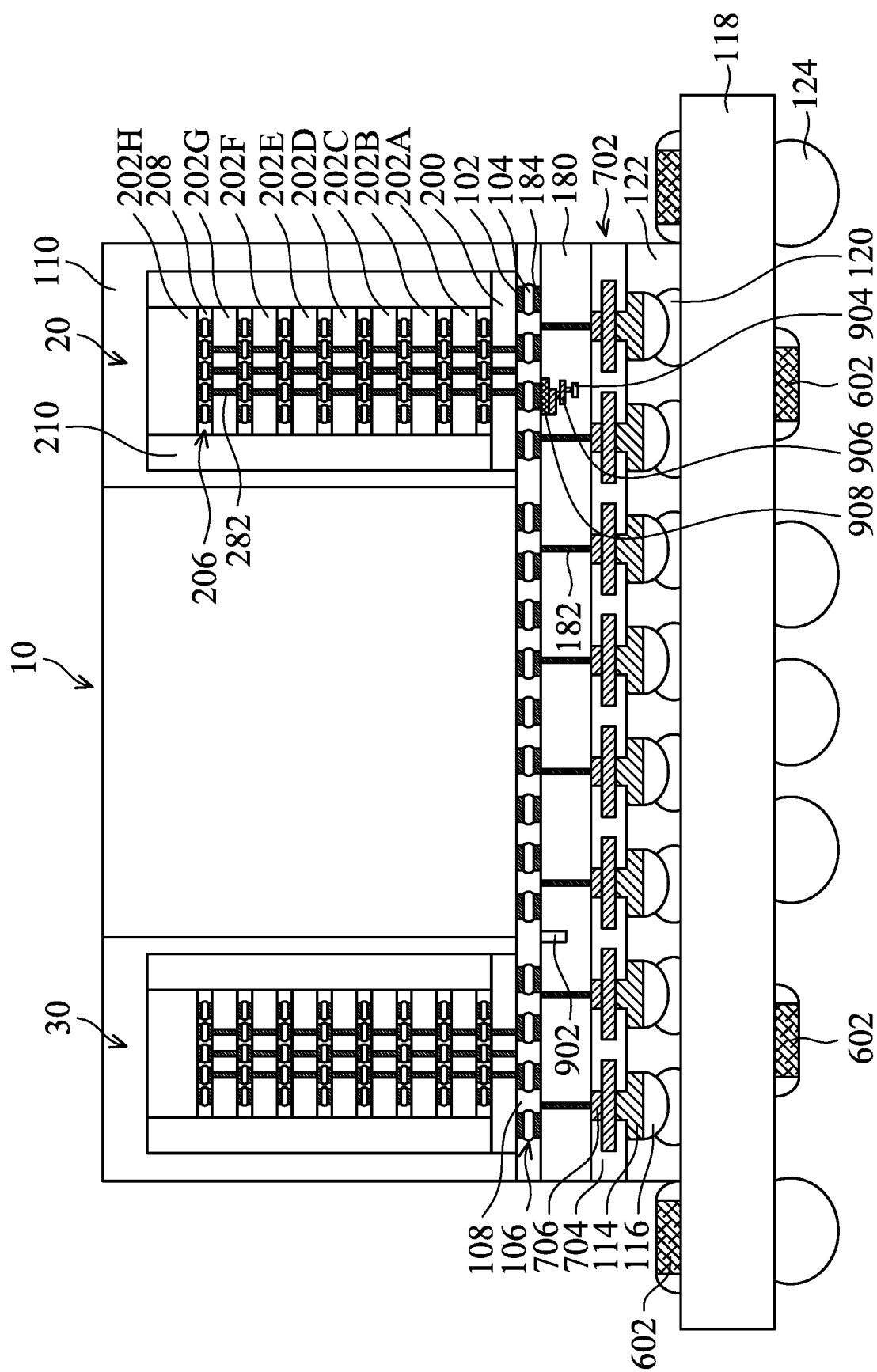
FIG. 11 is a cross-sectional view of a chip package, in accordance with some embodiments.

Many variations and/or modifications can be made to embodiments of the disclosure. FIG. 11 is a cross-sectional view of a chip package, in accordance with some embodiments. The structure shown in FIG. 11 is similar to that shown in FIG. 1F. In some embodiments, the chip package comprises a redistribution structure 702 between the substrate 180 and the metal pillars 114. The redistribution structure 702 has been described above with reference to FIG. 7, and the description is not repeated herein. In some embodiments, the substrate 180 comprises one or more passive devices 902 and one or more active devices 904. The one or more passive devices 902 and the one or more active devices 904 have been described above with reference to FIG. 9, and the description is not repeated herein.

In the embodiment illustrated in FIG. 11, the top surface of the semiconductor chip 10 and the top surface of the package layer 110 are substantially coplanar with each other. In other embodiments, the top surface of the semiconductor chip 10, the top surface of the package layer 110 and the top surfaces of the chip stacks 20 and 30 are substantially coplanar with each other, such as described above with reference to FIG. 6.

Figure 12:
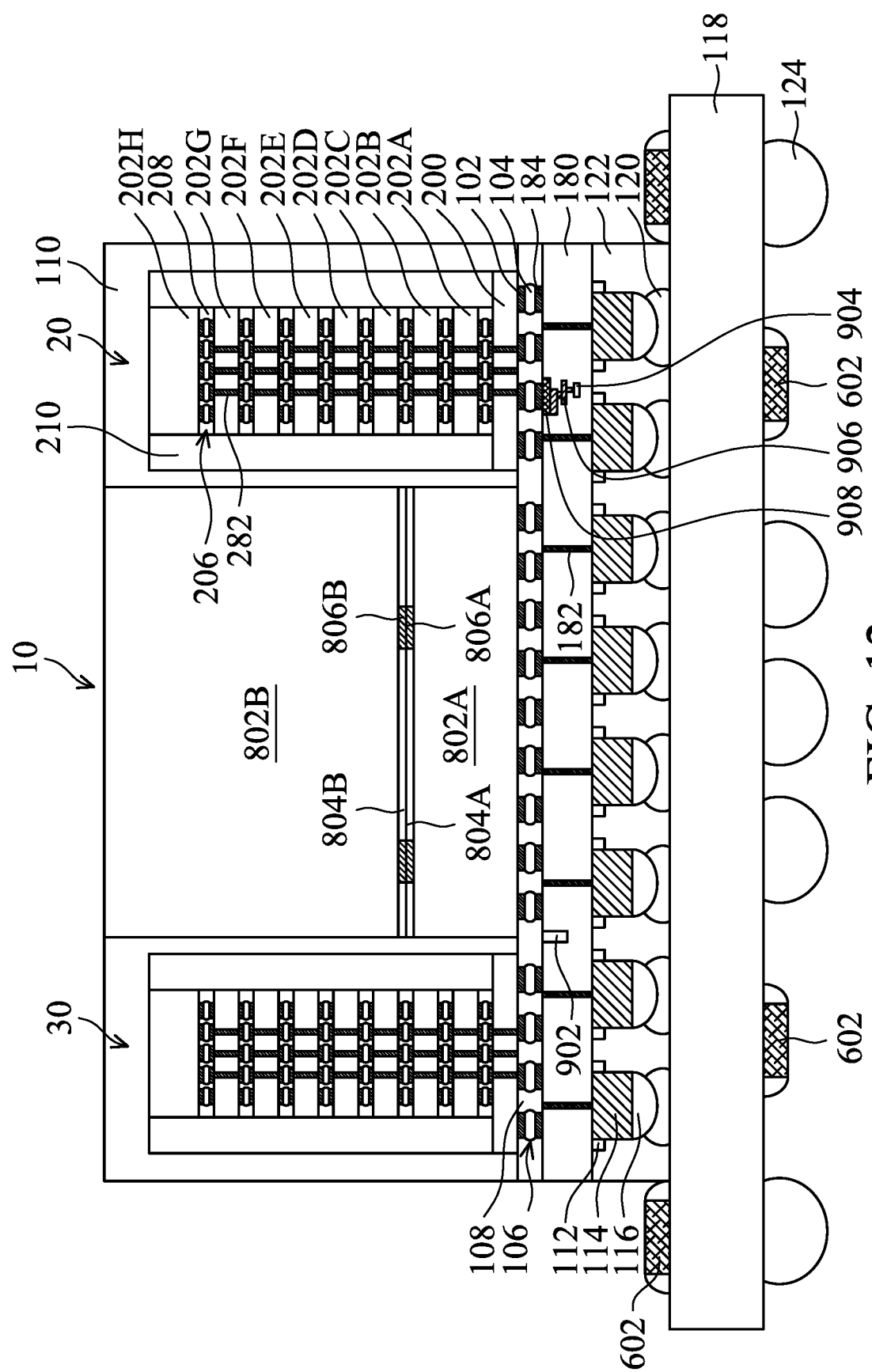
FIG. 12 is a cross-sectional view of a chip package, in accordance with some embodiments.

Many variations and/or modifications can be made to embodiments of the disclosure. FIG. 12 is a cross-sectional view of a chip package, in accordance with some embodiments. The structure shown in FIG. 12 is similar to that shown in FIG. 1F. In some embodiments, the semiconductor chip 10 comprises a multi-die stack comprising integrated circuit dies 802A and 802B. The multi-die stack has been described above with reference to FIG. 8, and the description is not repeated herein. In some embodiments, the substrate 180 comprises one or more passive devices 902 and one or more active devices 904. The one or more passive devices 902 and the one or more active devices 904 have been described above with reference to FIG. 9, and the description is not repeated herein.

In the embodiment illustrated in FIG. 12, the top surface of the semiconductor chip 10 and the top surface of the package layer 110 are substantially coplanar with each other. In other embodiments, the top surface of the semiconductor chip 10, the top surface of the package layer 110 and the top surfaces of the chip stacks 20 and 30 are substantially coplanar with each other, such as described above with reference to FIG. 6.

Figure 13:
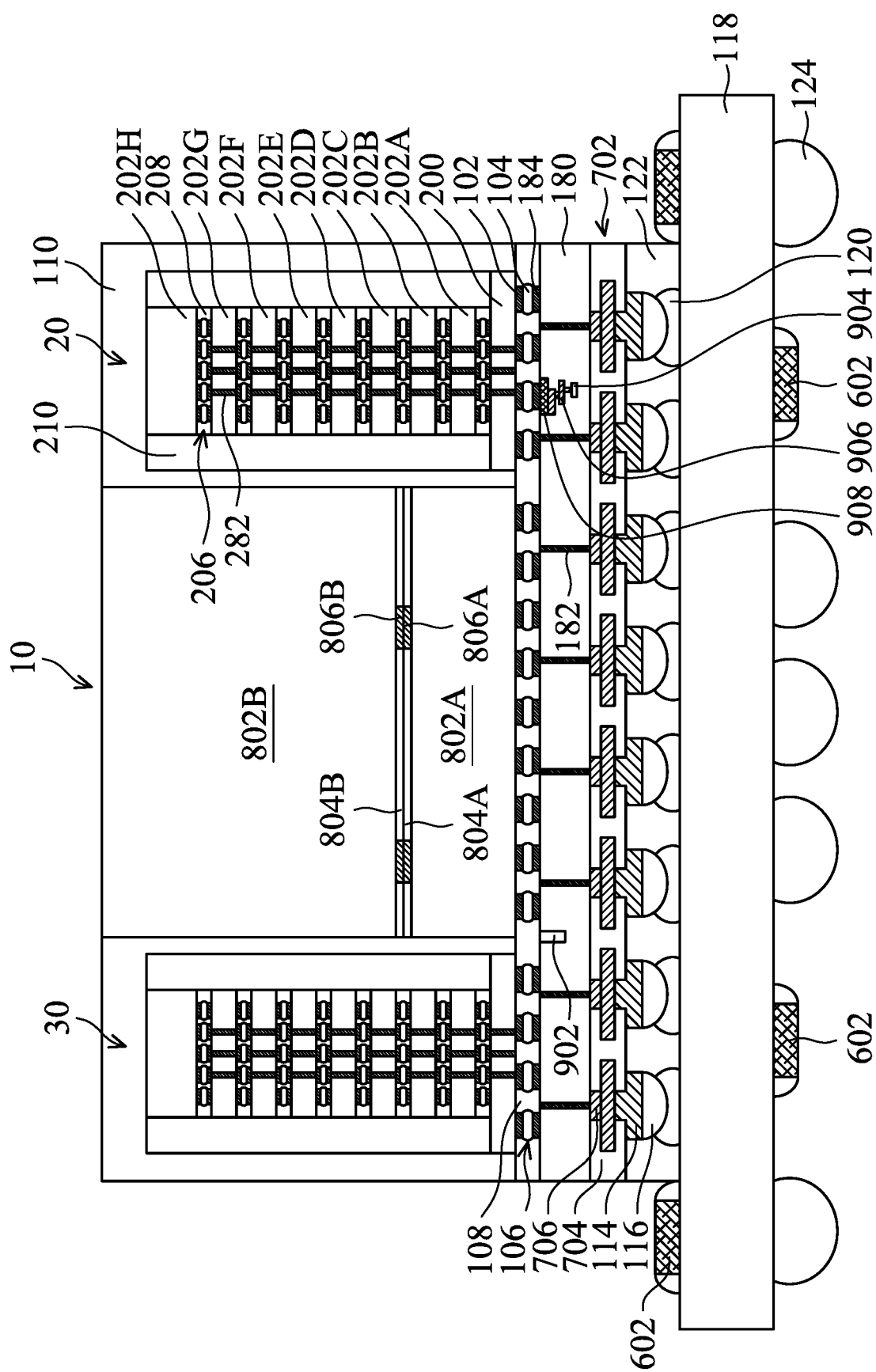
FIG. 13 is a cross-sectional view of a chip package, in accordance with some embodiments.

Many variations and/or modifications can be made to embodiments of the disclosure. FIG. 13 is a cross-sectional view of a chip package, in accordance with some embodiments. The structure shown in FIG. 13 is similar to that shown in FIG. 1F. In some embodiments, the chip package comprises a redistribution structure 702 between the substrate 180 and the metal pillars 114. The redistribution structure 702 has been described above with reference to FIG. 7, and the description is not repeated herein. In some embodiments, the semiconductor chip 10 comprises a multi-die stack comprising integrated circuit dies 802A and 802B. The multi-die stack has been described above with reference to FIG. 8, and the description is not repeated herein. In some embodiments, the substrate 180 comprises one or more passive devices 902 and one or more active devices 904. The one or more passive devices 902 and the one or more active devices 904 have been described above with reference to FIG. 9, and the description is not repeated herein.

In the embodiment illustrated in FIG. 13, the top surface of the semiconductor chip 10 and the top surface of the package layer 110 are substantially coplanar with each other. In other embodiments, the top surface of the semiconductor chip 10, the top surface of the package layer 110 and the top surfaces of the chip stacks 20 and 30 are substantially coplanar with each other, such as described above with reference to FIG. 6.

Embodiments of the disclosure form a chip package including a first semiconductor chip and a second semiconductor chip that may be a chip stack. The heights of the first semiconductor chip and the second semiconductor chip are different. A package layer, such as a molding compound layer, is formed to encapsulate the first semiconductor chip and the second semiconductor chip. The package layer is thinned to expose the first semiconductor chip. During the thinning process, the second semiconductor chip is protected by the package layer without being directly ground. The second semiconductor chip (or chip stack) is prevented from negatively affected due to the protection of the package layer during the thinning process. The performance and reliability of the chip package are significantly improved.

In accordance with some embodiments, a chip package is provided. The chip package includes a chip stack including a number of semiconductor dies. The chip package also includes a semiconductor chip, and the semiconductor chip is higher than the chip stack. The chip package further includes a package layer covering a top and sidewalls of the chip stack and sidewalls of the semiconductor chip.

In accordance with some embodiments, a chip package is provided. The chip package includes a first semiconductor chip and a second semiconductor chip. The chip package also includes a molding compound layer surrounding the first semiconductor chip and the second semiconductor chip. The molding compound layer covers a top surface of the first semiconductor chip, and a top surface of the molding compound layer is substantially coplanar with a top surface of the second semiconductor chip.

In accordance with some embodiments, a method for forming a chip package is provided. The method includes bonding a first semiconductor chip and a second semiconductor chip over a substrate. The method also includes forming a package layer over the substrate to encapsulate the first semiconductor chip and the second semiconductor chip. The method further includes planarizing the package layer so that a top surface of the second semiconductor chip is exposed, and a top surface of the first semiconductor chip is covered by the package layer.

In accordance with some embodiments, a package is provided. The package includes a substrate, and a first chip stack bonded to the substrate. The package also includes a second chip stack bonded to the substrate adjacent the first chip stack. The package further includes a molding compound layer extending along a first side of the first chip stack, the first side of the first chip stack being a farthest side of the first chip stack from the substrate.

In accordance with some embodiments, a package is provided. The package includes a substrate, and a first semiconductor chip attached to the substrate. The package also includes a second semiconductor chip attached to the substrate, the first semiconductor chip and the second semiconductor chip being attached to a same side of the substrate. The package further includes a molding compound layer surrounding the first semiconductor chip and the second semiconductor chip, the molding compound layer covering a top surface of the first semiconductor chip.

In accordance with some embodiments, a package is provided. The package includes a substrate, a semiconductor chip bonded to the substrate, and a first chip stack bonded to the substrate. The package also includes an underfill layer extending between the semiconductor chip and the substrate and between the first chip stack and the substrate, at least a portion of the underfill layer extending along sidewalls of the semiconductor chip and along sidewalls of the first chip stack. The package further includes a package layer over the underfill layer, the package layer extending along a topmost surface of the first chip stack, an interface between the underfill layer and package layer being above a bottommost surface of the first chip stack and below the topmost surface of the first chip stack.

In accordance with some embodiments, a package is provided. A package includes a substrate, a first chip stack attached to the substrate, and a second chip stack attached to the substrate. The first chip stack and the second chip stack being attached to a same side of the substrate. The package further includes a molding compound layer surrounding the first chip stack and the second chip stack. The molding compound layer covers a topmost surface of the first chip stack. A topmost surface of the molding compound layer is substantially coplanar with a topmost surface of the second chip stack.

In accordance with some embodiments, a package is provided. A package includes a substrate, the substrate having a first surface and a second surface, the second surface being opposite the first surface, and a first chip stack bonded to the first surface of the substrate. The package further includes a second chip stack bonded to the first surface of the substrate adjacent the first chip stack, the second chip stack being higher than the first chip stack, and a molding compound layer extending along a topmost surface of the first chip stack, the topmost surface of the first chip stack being a farthest surface of the first chip stack from the substrate.

In accordance with some embodiments, a package is provided. A package includes a substrate, a first chip stack bonded to the substrate, a second chip stack bonded to the substrate, and an underfill layer extending between the first chip stack and the substrate and between the second chip stack and the substrate. At least a portion of the underfill layer extends along sidewalls of the first chip stack and along sidewalls of the second chip stack. The package further includes a package layer over the underfill layer. The package layer extends along a topmost surface of the first chip stack. An interface between the underfill layer and the package layer is above a bottommost surface of the first chip stack and below the topmost surface of the first chip stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a substrate, the substrate having a first surface and a second surface, the second surface being opposite the first surface;
   a first chip stack bonded to the first surface of the substrate;
   a second chip stack bonded to the first surface of the substrate adjacent the first chip stack, the second chip stack being higher than the first chip stack; and
   a molding compound layer extending along a topmost surface of the first chip stack, the topmost surface of the first chip stack being a farthest surface of the first chip stack from the substrate.

2. The package of claim 1, further comprising an underfill layer interposed between the substrate and the molding compound layer.

3. The package of claim 2, wherein a topmost surface of the underfill layer is above a bottommost surface of the first chip stack and a bottommost surface of the second chip stack.

4. The package of claim 1, wherein a topmost surface of the molding compound layer is substantially coplanar with a topmost surface of the second chip stack.

5. The package of claim 1, further comprising a redistribution structure on the second surface of the substrate, the redistribution structure being electrically coupled to the first chip stack and the second chip stack through the substrate.

6. The package of claim 1, wherein the substrate comprises at least one of a passive device and an active device.

7. The package of claim 1, wherein the second chip stack comprises a first integrated circuit die bonded to a second integrated circuit die, a first bond pad of the first integrated circuit die being in physical contact with a second bond pad of the second integrated circuit die.

8. A package comprising:
   a substrate;
   a first chip stack bonded to the substrate;
   a second chip stack bonded to the substrate;
   an underfill layer extending between the first chip stack and the substrate and between the second chip stack and the substrate, at least a portion of the underfill layer extending along sidewalls of the first chip stack and along sidewalls of the second chip stack; and
   a package layer over the underfill layer, the package layer extending along a topmost surface of the first chip stack, an interface between the underfill layer and the package layer being above a bottommost surface of the first chip stack and below the topmost surface of the first chip stack.

9. The package of claim 8, wherein the first chip stack comprises:
   a plurality of integrated circuit dies; and
   an encapsulant extending along sidewalls of the plurality of integrated circuit dies and across the interface between the underfill layer and package layer.

10. The package of claim 9, wherein the encapsulant extends along and physically contacts a topmost surface of at least one integrated circuit die of the plurality of integrated circuit dies.

11. The package of claim 8, wherein the second chip stack comprises:
   a first integrated circuit die, the first integrated circuit die comprising a first bond pad embedded into a first insulating layer; and
   a second integrated circuit die bonded to the first integrated circuit die, the second integrated circuit die comprising a second bond pad embedded into a second insulating layer, the first insulating layer being in physical contact with the second insulating layer, the first bond pad being in physical contact with the second bond pad.

12. The package of claim 8, wherein a topmost surface of the second chip stack is substantially level with a topmost surface of the package layer.

13. The package of claim 8, further comprising a redistribution structure in electrical contact with the substrate, the substrate being interposed between the first chip stack and the redistribution structure.

14. A package comprising:
   an interposer substrate, the interposer substrate comprising at least one of a passive device and an active device, the interposer substrate having a first surface and a second surface opposite the first surface;
   a first chip structure attached to the first surface of the interposer substrate, wherein the first chip structure comprises a first integrated circuit die bonded to a second integrated circuit die, a first insulating layer on a first side of the first integrated circuit die being in physical contact with a second insulating layer on a second side of the second integrated circuit die;
   a redistribution structure on the second surface of the interposer substrate; and a molding compound layer surrounding the first chip structure, a topmost surface of the molding compound layer being substantially level with a topmost surface of the first chip structure.

15. The package of claim 14, further comprising a second chip structure attached to the first surface of the interposer substrate, wherein the first chip structure has a greater height than the second chip structure.

16. The package of claim 15, wherein the molding compound layer extends along sidewalls of the second chip structure and covers a topmost surface of the second chip structure.

17. The package of claim 15, further comprising an underfill layer surrounding the first chip structure and the second chip structure, an interface between the underfill layer and the molding compound layer being above a bottommost surface of the first chip structure and a bottommost surface of the second chip structure.

18. The package of claim 15, wherein the second chip structure comprises:
a stack of integrated circuit dies; and
an encapsulant extending along a sidewall of the stack of integrated circuit dies, the molding compound layer extending along a sidewall of the encapsulant.

19. The package of claim 14, further comprising a plurality of connectors bonded to the redistribution structure, the redistribution structure being interposed between the second surface of the interposer substrate and the plurality of connectors.

20. The package of claim 14, further comprising:
a first bond pad embedded into the first insulating layer; and
a second bond pad embedded into the second insulating layer, the first bond pad being in physical contact with the second bond pad.

* * * * *